(12) United States Patent  
Mohseni

(10) Patent No.: US 7,745,816 B2
(45) Date of Patent: Jun. 29, 2010

(54) SINGLE-PHOTON DETECTOR WITH A QUANTUM DOT AND A NANO-INJECTOR

(75) Inventor: Hooman Mohseni, Wilmette, IL (US)

(73) Assignee: Northwestern University, Evanston, IL (US)

(*) Notice: Subject to any disclaimer, the term of this patent is extended or adjusted under 35 U.S.C. 154(b) by 422 days.

(21) Appl. No.: 11/528,089

(22) Filed: Sep. 27, 2006

(65) Prior Publication Data

US 2010/0123120 A1  May 20, 2010

Related U.S. Application Data

(60) Provisional application No. 60/721,007, filed on Sep. 27, 2005.

(51) Int. Cl.
*H01L 29/06* (2006.01)
*H01L 31/00* (2006.01)
*H01L 29/08* (2006.01)

(52) U.S. Cl. .................. 257/21; 257/9; 257/12; 257/14; 257/15; 257/17; 257/25; 257/30

(58) Field of Classification Search .......... 257/21, 257/20, 9, 12, 14, 15, 17, 25, 30
See application file for complete search history.

(56) References Cited

U.S. PATENT DOCUMENTS 4,688,068 A * 8/1987 Chaffin et al. ............ 136/249

| | | | |
|---|---|---|---|
| 5,216,262 A | 6/1993 | Tsu | |
| 6,603,138 B2 | 8/2003 | Arakawa et al. | |
| 6,720,589 B1 | 4/2004 | Shields | |
| 7,180,648 B2 * | 2/2007 | Dohrman et al. | ............ 359/248 |

* cited by examiner

*Primary Examiner*—Phat X Cao
*Assistant Examiner*—Diana C Garrity
(74) *Attorney, Agent, or Firm*—Morris, Manning & Martin LLP; Tim Tingkang Xia

(57) ABSTRACT

A semiconductor photodetector for photon detection without the use of avalanche multiplication, and capable of operating at low bias voltage and without excess noise. In one embodiment, the photodetector comprises a plurality of InP/AlInGaAs/AlGaAsSb layers, capable of spatially separating the electron and the hole of an photo-generated electron-hole pair in one layer, transporting one of the electron and the hole of the photo-generated electron-hole pair into another layer, focalizing it into a desired volume and trapping it therein, the desired volume having a dimension in a scale of nanometers to reduce its capacitance and increase the change of potential for a trapped carrier, and a nano-injector, capable of injecting carriers into the plurality of InP/AlInGaAs/AlGaAsSb layers, where the carrier transit time in the nano-injector is much shorter than the carrier recombination time therein, thereby causing a very large carrier recycling effect.

23 Claims, 14 Drawing Sheets

(A)

(B)

SINGLE-PHOTON DETECTOR WITH A QUANTUM DOT AND A NANO-INJECTOR

CROSS-REFERENCE TO RELATED PATENT APPLICATION

This application claims the benefit, pursuant to 35 U.S.C. §119(e), of U.S. provisional patent application Ser. No. 60/721,007, filed Sep. 27, 2005, entitled "focalized carrier augmented sensors for single photon detection," by Hooman Mohseni, which is incorporated herein by reference in its entirety.

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference was individually incorporated by reference. In terms of notation, hereinafter, "[n]" represents the nth reference cited in the reference list. For example, [37] represents the 37th reference cited in the reference list, namely, H. Mohseni, Y. Wei, and M. Razeghi, "High performance type-II InAs/GaSb superlattice photodiodes," SPIE, vol. 4288, pp. 191-199, 2001.

STATEMENT AS TO RIGHTS UNDER FEDERALLY-SPONSORED RESEARCH

This invention was made with Government support under Contract No. HR0011-05-1-0058 awarded by Defense Advanced Research Projects Agency (DARPA) of the United States. The Government has certain rights in this invention.

FIELD OF THE INVENTION

The present invention relates generally to photon detection, and more particularly to a photodetector and methods capable of single photon detection.

BACKGROUND OF THE INVENTION

A single photon detector (hereinafter "SPD") provides the ultimate limit of extremely weak electromagnetic radiation detection in term of sensitivity. Compact solid-state SPDs are regarded as enabling components in a wide range of applications such as biophotonics, tomography, homeland security, non-destructive material inspection, astronomy, quantum key distribution, and quantum imaging. Despite the astonishing progress of these fields in recent years, there has been little progress in the performance of SPDs, and thus the SPD is quickly becoming the "bottleneck" in these fields. Some of the important shortcomings of the current SPDs are: poor quantum efficiency, high dark count rates, lack of imaging arrays, severe cooling requirement for longer wavelengths, and large dead-times (low bandwidth) due to after-pulsing. Unfortunately, these problems become much more significant for wavelengths beyond visible range where a large number of applications can benefit the most. In particular, these drawbacks have prevented demonstration of the much-needed high-performance SPDs beyond the visible wavelength, and high-performance arrays of SPDs. Many applications can drastically benefit from two-dimensional imaging arrays of SPD, and SPDs that can operate in the longer wavelengths including: infrared mammography [2, 3], infrared tomography [4], molecular infrared florescent imaging [5-7], quantum imaging [8-10], infrared non-destructive inspection [11, 12] and remote detection of buried landmines [13-15].

There has been a rapid growth in research on SPDs, evident by an exponential increase in the number of related published papers over the past decade [1]. However, most of the works on compact solid-state SPDs have been focused on Geiger mode avalanche photodetectors (hereinafter "APD") [16-19]. There are inherent drawbacks in the avalanche process that hinder realization of short and mid-infrared SPDs, as well as high-performance 2D SPD arrays. Some of these inherent physical limitations are:

Material Limitations: Almost all compound semiconductors that can provide longer wavelength detectors have a low ionization ratio, and subsequently a poor performance.

High Tunneling and Generation Rates: High electric filed leads to a high tunneling rate, even in the wide bandgap material, and tunneling current becomes the main source of the dark counts in modern APDs [19]. Also, the fully depleted avalanche region produces the maximum Shockley-Read-Hall (hereinafter "SRH") generation noise [20].

Poor Uniformity: A fraction of a percent variation in doping or layer thickness can result in significant shifts in gain, dark current, breakdown voltage, and frequency response [21]. Temperature and bias variations would prevent realization of a uniform large-area 2D array.

High Photon Emission: The energetic (hot) carriers that are required for avalanche process can also produce photons. In fact, avalanche detectors are known to produce "photon flashes" that are three to four orders of magnitude brighter than the incoming beam. The produced photons can severely interfere with the other components of the system in a single element SPD [22], and produce a significant crosstalk in an arrayed SPD [23].

These problems have encouraged research on alternative detection methods such as superconductor-base infrared detectors [24, 25], and quantum dot infrared detectors [26, 27]. Although these methods can potentially alleviate a large number of problems associated with avalanche-based SPDs, they require extremely low operating temperatures, about 4° K., which prevent their practical utilization in many applications. Quantum dot SPDs should be able to operate at much higher temperatures. However, their low quantum efficiency remains a serious problem. This is an inherent problem, and a consequence of the extremely small dimension of quantum dots compared with the wavelength of the infrared light.

Therefore, a heretofore unaddressed need exists in the art to address the aforementioned deficiencies and inadequacies.

SUMMARY OF THE INVENTION

The present invention, in one aspect, relates to a multilayer structure for photon detection. In one embodiment, the multilayer structure includes a photon absorption layer; a first carrier barrier layer formed on the photon absorption layer; a carrier mobile layer formed on the first carrier barrier layer; and a second carrier barrier layer formed on the carrier mobile layer to have a carrier barrier region and an oxidized region surrounding the carrier barrier region, where the carrier barrier region has a dimension, d, in a scale of nanometers. The carrier mobile layer and the first and second carrier barrier layers are configured to form a first energy band structure having a quantum well in the carrier mobile layer. In one embodiment, the dimension d of the carrier barrier region of the second carrier barrier layer is in a range of about 1-500 nm, preferably in a range of about 10-200 nm. The multilayer structure further includes a first metallic element in contact with the second carrier barrier layer and positioned such that the carrier barrier region of the second carrier barrier layer is between the first metallic element and the carrier mobile layer; a second metallic element in contact with at least the photon absorption layer; and a power source electrically coupled to the first metallic element and the second metallic element, respectively. The multilayer structure also includes a substrate on which the photon absorption layer is formed, where the substrate is made from one of a semiconductor material, a metallic material and an insulating material.

In one embodiment, the photon absorption layer has a second energy band structure with a valence band and a conduction band, and when a photon is incident to the photon absorption layer, an electron in the photon absorption layer absorbs the photon to transit from the valance band to the conduction band and a hole is generated in the valence band in response, thereby forming an electron-hole pair. The first energy band structure and the second energy band structure are formed such that the electron-hole pair is spatially separated into an electron and a hole. When a voltage is applied to the first metallic element and the second metallic element from the power source, an electric field is established with a lateral component and a vertical component and a stream of electrons move into the carrier barrier region from the first metallic element. In one embodiment, the lateral component of the electric field causes the hole to move towards a volume of the carrier mobile layer underneath the carrier barrier region and be trapped therein, thereby deforming the first energy band structure to enhance a rate of the stream of electrons tunneling through the volume of the carrier mobile layer into the photon absorption layer, resulting in a measurable increase of a corresponding electric current. Each of the stream of electrons moves towards to the second metallic element from the first metallic element unless it is recombined with the trapped hole in the volume, or until the trapped hole is thermally exited and leaves the volume. In one embodiment, the stream of electrons is augmented in a limited region of the photon absorption layer after tunneling through the volume of the carrier mobile layer, where the limited region of the photon absorption layer is located under the volume of the carrier mobile layer.

In one embodiment, the trapped hole in the volume has a lifetime, $\tau_h$, and the stream of electrons has a transition time, $\tau_{trans}$, for tunneling through the volume, where $\tau_h \gg \tau_{trans}$.

In one embodiment, the carrier mobile layer is made from a hole transporting material, and each of the first and second carrier barrier layers is made from an electron barrier material. The first carrier barrier layer is made from a semiconductor material. The second carrier barrier layer is made from a semiconductor material that is same as or different from the semiconductor material of the first carrier barrier layer. The photon absorption layer is made from a semiconductor material.

In another aspect, the present invention relates to a multilayer structure for photon detection. In one embodiment, the multilayer structure has a plurality of periodically interchanging semiconductor layers having an energy band structure with a valence band and a conduction band formed such that when a photon is incident to one layer, an electron in the one layer absorbs the photon to transit from the valance band to the conduction band and a hole is generated in the valence band in response; and an electron injecting member in contact with the plurality of periodically interchanging semiconductor layers for injecting electrons into the plurality of periodically interchanging semiconductor layers so as to establish an electric field with a lateral component and a vertical component therein, where the lateral component of the electric field causes the generated hole in the one layer to move towards a desired volume in another layer and be trapped therein, thereby deforming the energy band structure to enhance a rate of the injected electrons tunneling through the desired volume, resulting in a measurable increase of a corresponding electric signal, where the desired volume has a dimension in a scale of nanometers. The electron injecting member comprises a metallic element positioned in relation to the plurality of periodically interchanging semiconductor layers such that the injected electrons move along a direction perpendicular to the periodically interchanging semiconductor layers from the electron injecting member towards the desired volume.

In one embodiment, the plurality of periodically interchanging semiconductor layers forms at least one quantum well. The plurality of periodically interchanging semiconductor layers forms a type II superlattice having a dimension in a scale of micrometers, where the type II superlattice has a vertical carrier mobility along a direction perpendicular to the periodically interchanging semiconductor layers and a lateral carrier mobility along a direction parallel to the periodically interchanging semiconductor layers, where the lateral carrier mobility is substantially greater than the vertical carrier mobility.

In one embodiment, the plurality of periodically interchanging semiconductor layers comprises at least one photon absorption layer for generating an electron-hole pair responsive to an incident photon. The plurality of periodically interchanging semiconductor layers also comprises at least a hole mobile layer.

In yet another aspect, the present invention relates to a photodetector for photon detection. In one embodiment, the photodetector includes a photon absorption region and a carrier trapping region, which are configured to have an energy band structure such that when a photon is incident to the photon absorption region, an electron-hole pair is generated therein responsively, and one of the electron and hole of the photo-generated electron-hole pair is transported and trapped into the carrier trapping region so as to enhance the concentration of the corresponding carrier therein to cause deformation of the energy band structure, thereby enhancing a rate of carriers tunneling through the carrier trapping region, resulting in a measurable increase of a corresponding electric signal. The carrier trapping region has a dimension in a scale of nanometers.

The photodetector further includes a carrier injecting member positioned in relation to the photon absorption region and the carrier trapping region for externally injecting carriers into the carrier trapping region, and wherein the external injected carriers are complementary to the one of the electron and the hole trapped in the carrier trapping region.

In a further aspect, the present invention relates to an apparatus for photon detection. In one embodiment, the apparatus includes a plurality of photodetectors spatially arranged in an array, each photodetector having a photon absorption region and a carrier trapping region, which are configured to have an energy band structure such that when a photon is incident to the photon absorption region, an electron-hole pair is generated therein responsively, and one of the electron and hole of the photo-generated electron-hole pair is transported and trapped into the carrier trapping region so as to enhance the concentration of the corresponding carrier therein to cause deformation of the energy band structure, thereby enhancing a rate of carriers tunneling through the carrier trapping region, resulting in a measurable increase of a corresponding electric signal. The carrier trapping region of each sensor has a dimension in a scale of nanometers.

In yet a further aspect, the present invention relates to a method for photon detection. In one embodiment, the method includes the steps of providing at least one photodetector having a photon absorption region and a carrier trapping region and an energy band structure with a quantum well; generating an electron-hole pair in the photon absorption region of the at least one photodetector responsive to an incident photon, where the electron-hole pair is spatially separated upon interaction with the energy band structure into an electron and a hole; establishing an electric field with a lateral component and a vertical component, where the lateral component of the electric field causes the hole to move towards the carrier trapping region and be trapped therein, thereby deforming the energy band structure to enhance a rate of electron tunneling through the carrier trapping region, resulting in a measurable increase of a corresponding electric signal; and measuring the measurable increase of a corresponding electric signal to detect the incident photon. The photon absorption region of the at least one photodetector has a dimension in a scale of micrometers, and the carrier trapping region of the at least one photodetector has a dimension in a scale of nanometers. In one embodiment, the establishing step comprises the step of injecting electrons into the at least one photodetector.

In one aspect, the present invention relates to an apparatus for photon detection. In one embodiment, the apparatus has a photon absorption region and a carrier trapping region configured to have an energy band structure with a quantum well such that when a photon is incident to the photon absorption region, an electron-hole pair is generated in the photon absorption region in response, where the electron-hole pair is spatially separated upon interaction with the energy band structure into an electron and a hole; means for establishing an electric field with a lateral component and a vertical component, where the lateral component of the electric field causes the hole to move towards the carrier trapping region and be trapped therein, thereby deforming the energy band structure to enhance a rate of electron tunneling through the carrier trapping region, resulting in a measurable increase of a corresponding electric signal; and means for measuring the measurable increase of a corresponding electric signal to detect the incident photon. The photon absorption region has a dimension in a scale of micrometers, and the carrier trapping region has a dimension in a scale of nanometers.

In another aspect, the present invention relates to a method of fabricating a photodetector. In one embodiment, the method has the steps of (a) providing a substrate; (b) growing a multilayered structure on the substrate having an absorption layer formed on the substrate, a first layer formed on the absorption layer, a second layer formed on the first layer, and a third layer formed on the second layer and a fourth layer formed on the third layer; (c) defining an negative photoresist pattern on the fourth layer of the multilayered structure such that the fourth layer is divided into a first region and a second region separated by the negative photoresist pattern thereon; (d) metallizing the defined negative photoresist pattern and the first and second regions of the fourth layer to form a metal layer thereon; (e) lifting off the negative photoresist pattern on the fourth layer so as to form a first metallic element in the first region and a second metallic element in the second region of the fourth layer, respectively; (f) etching off a region of the fourth layer under the negative photoresist pattern to uncover a corresponding region of the third layer; (g) oxidizing the uncover region of the third layer of the multilayered structure so as to form an oxidized region therein and a carrier barrier region under the first metallic element; and (h) planarizing and passivating the oxidized region of the third layer and the first and second metallic elements to form a photodetector. The method further has the step of forming a top metallic element on the first metallic element.

In one embodiment, the growing step is performed with a molecular beam epitaxy (MBE) process and/or a metal oxide chemical vapor deposition (MOCVD) process. The defining step is performed with an E-beam process and/or a photo-lithographical process. The metallizing step is performed with a metal evaporation process. The etching step is performed with an ICP-RIE etching process. These steps can also be performed by other processes known to people skilled in the art.

In one embodiment, the first layer is formed with a first material, the third layer is formed with a third material that is same as or different from the first material, and the second layer is formed with a second material that is substantially different from each the first material and the second material. Each of the first material and the third material is capable of blocking one type of carriers, and the second material is capable of transporting the other type of carriers.

In yet another aspect, the present invention relates to a method of fabricating a photodetector. In one embodiment, the method includes the steps of growing an epi-layer having a first layer, a second layer formed on the first layer, and a third layer formed on the second layer; and performing a self-alignment and lateral oxidization process on the grown epi-layer to fabricate a photodetector.

The epi-layer comprises a type-II heterojunction structure. In one embodiment, the growing step is performed with a molecular beam epitaxy (MBE) process and/or ametal oxide chemical vapor deposition (MOCVD) process.

In one embodiment, the step of performing the self-alignment and lateral oxidization process includes the steps of forming an metallic element on the third layer of the epi-layer by metallization and liftoff processes; etching off the third layer of the epi-layer so as to leave a potion of the third layer under the metallic element and uncover a region of the second layer by a dry etching process; metallizing the metallic element and the uncovered region of the second layer by a metal evaporation process; performing a metal plating process on the metallized metallic element; and performing a lateral oxidation and etching process on the processed epi-layer.

In a further aspect, the present invention relates to a method of fabricating a photodetector. In one embodiment, the method includes the steps of (i) growing an epi-layer having a first layer, a second layer formed on the first layer, and a third layer formed on the second layer; and performing a self-alignment and self-isolation process on the grown epi-layer to fabricate a photodetector.

In one embodiment, the step of performing the self-alignment and self-isolation process includes the steps of (i) forming an metallic element on the third layer of the epi-layer by a metallization and liftoff process; (ii) etching off the third layer and the second layer of the epi-layer so as to leave a potion of the third layer and a portion of the second layer under the metallic element and uncover a region of the first layer by a dry etching process; (iii) forming a silicon nitride ($Si_3N_4$) layer on the uncovered region of the first layer and the metallic element by a plasma enhanced chemical vapor deposition (PECVD) process; (iv) dry etching the $Si_3N_4$ layer formed on the uncovered region of the first layer and the metallic element to form an etched surfaces of the first layer and the metallic element, respectively; (v) metallizing the etched surfaces of the first layer and the metallic element to form a metal layer on the metallic element and a metal layer on the etched surface of the first layer by a metal evaporation process; (vi) anodizing the metal layer to form an nodization layer thereon; and (vii) metallizing the nodization layer and the metal layer to form a metal layer thereon by a metal evaporation process.

In yet a further aspect, the present invention relates to a nano-transistor. In one embodiment, the nano-transistor comprises a photon absorption member; and a carrier injecting member having a first layer formed on the photon absorption member and a second layer formed on the first layer and adapted for injecting carriers from the second layer into the photon absorption member. The photon absorption member and the first and second layers are configured to have an energy band structure such that when a photon is incident to the photon absorption member, an electron-hole pair is generated therein responsively, and one of the electron and hole of the photo-generated electron-hole pair is transported and trapped into the first layer so as to enhance the concentration of the corresponding carrier therein to a level that causes deformation of the energy band structure, thereby enhancing a rate of injected carriers tunneling through the first layer into the photon absorption layer. In one embodiment, the photon absorption member has a dimension in a scale of micrometers, and the carrier injecting member has a dimension in a scale of nanometers.

In one aspect, the present invention relates to an array formed with a plurality of nano-transistors as disclosed above.

In another aspect, the present invention relates to a nano-resonator. In one embodiment, the nano-resonator has a photon absorption member; and a carrier injecting member having a first layer formed on the photon absorption member, a second layer formed on the first layer, a third layer formed on the second layer, and a fourth layer formed on the third layer, and adapted for injecting carriers from the fourth layer into the photon absorption member. The photon absorption member has a dimension in a scale of micrometers, and the carrier injecting member has a dimension in a scale of nanometers. The photon absorption member and the first to fourth layers are configured to have an energy band structure such that when a photon is incident to the photon absorption member, an electron-hole pair is generated therein responsively, and one of the electron and hole of the photo-generated electron-hole pair is transported and trapped into the second layer so as to enhance the concentration of the corresponding carrier therein to a level that causes deformation of the energy band structure, thereby enhancing a rate of injected carriers tunneling through the second layer into the photon absorption layer.

In yet another aspect, the present invention relates to an array formed with a plurality of nano-resonators as disclosed above.

In a further aspect, the present invention relates to a nano-electromechanical switch. In one embodiment, the nano-electromechanical switch includes a photon absorption member; and a carrier injecting member having a nano-tip positioned above the photon absorption member to define a gap therebetween for injecting carriers into the photon absorption member. The photon absorption member has a dimension in a scale of micrometers. The photon absorption member and the nano-tip are adapted such that when a photon is incident to the photon absorption member, an electron-hole pair is generated therein responsively, and one of the electron and hole of the photo-generated electron-hole pair is transported and trapped in a volume underneath the nano-tip, which enhances a rate of injected carriers from the nano-tip tunneling through the gap into the absorption member. In one embodiment, the gap has a gap width, g, that is variable.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein.

DETAILED DESCRIPTION OF THE INVENTION

Figure 1A:
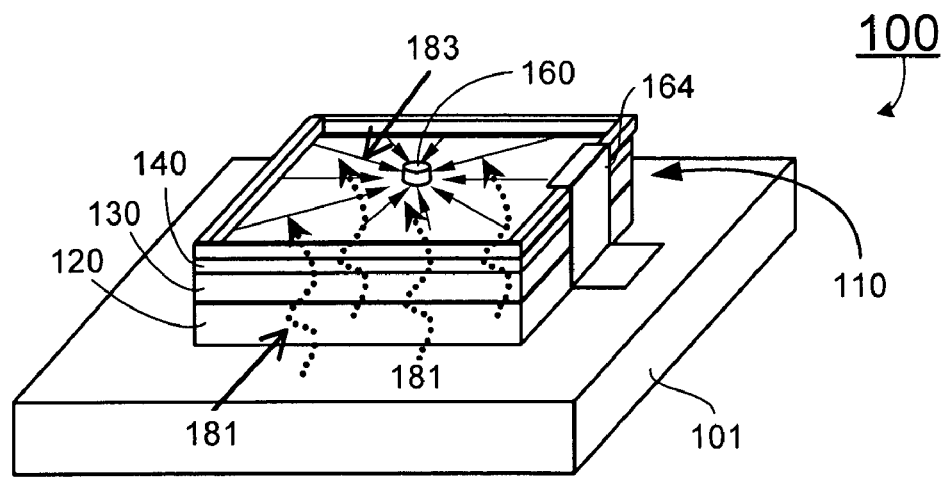
FIG. 1 shows schematically a single photon detector according to one embodiment of the present invention, (A) a perspective view showing lateral focalization of photo-generated holes, (B) a cross-sectional view showing vertical concentration and transportation of the photo-generated holes through a hole channel, and (C) a partially enlarged cross-sectional view of a multilayer structure of the single photon detector.

The present invention is more particularly described in the following examples that are intended as illustrative only since numerous modifications and variations therein will be apparent to those skilled in the art. Various embodiments of the invention are now described in detail. Referring to the drawings, like numbers indicate like parts throughout the views. As used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which has no influence on the scope of the invention. Additionally, some terms used in this specification are more specifically defined below.

DEFINITIONS

The terms used in this specification generally have their ordinary meanings in the art, within the context of the invention, and in the specific context where each term is used.

Certain terms that are used to describe the invention are discussed below, or elsewhere in the specification, to provide additional guidance to the practitioner in describing the apparatus and methods of the invention and how to make and use them. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that the same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification, including examples of any terms discussed herein, is illustrative only, and in no way limits the scope and meaning of the invention or of any exemplified term. Likewise, the invention is not limited to various embodiments given in this specification. Furthermore, subtitles may be used to help a reader of the specification to read through the specification, which the usage of subtitles, however, has no influence on the scope of the invention.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "quantum well" refers to a double heterojunction structure including an ultrathin layer of a semiconductor material sandwiched by a first outer layer of a semiconductor material and a second outer layer of a semiconductor material, where the bandgap of the ultrathin layer of the semiconductor material is smaller than that of the first outer layer of the semiconductor material and the second outer layer of the semiconductor material. The sandwiched structure forms conduction band and valence band potential wells within which electrons are confined in the conduction band potential well and holes are confined in the valence band potential well, respectively. A quantum well is a potential well that confines carriers (electrons, holes, or electron-hole pairs) therein, forcing them to occupy a planar region.

The term "quantum dot", as used herein, refers to a heterojunction structure having potential wells formed such that carriers (electrons, holes, or electron-hole pairs) are confined in a small region in all three dimensions. This confinement leads to discrete quantized energy levels and to the quantization of charge in units of the elementary electric charge, e. Because the quantum dot has discrete energy levels, much like an atom, it is sometimes called "an artificial atom". The energy levels of the quantum dot can be controlled by changing the size and shape of the quantum dot, and the depth of the potential.

As used herein, the term "superlattice" refers to a multilayered heterojunction structure of different semiconductor materials that alternate with each other, forming multiple quantum wells therein, whose energy barriers between the adjacent quantum wells are substantially thin so that electrons can readily tunnel through (quantum mechanically penetrate) the barriers between them, the discrete energy levels broaden into miniature bands. The multilayered heterojunction structure has the energy bandgap varying with position in a desired manner. For motion perpendicular to the layer, the allowed energy levels for electrons in the conduction band, and for holes in the valence band, are discrete and well separated.

OVERVIEW OF THE INVENTION

A photon detector is a transducer that converts the optical signal into an electrical signal. Therefore, a primary process in all of the existing photon detectors is photon absorption. This process is then followed by generation of an electrical signal, either directly from the photo-generated carriers in the so-called "direct photon detectors" or through the change of temperature in the so-called "thermal detectors". Since the energy of a single IR photon is only a fraction of an atto-joule, thermal detection of a photon requires an extremely low detector temperature, e.g., superconductor-based SPDs. This means that an uncooled or slightly cooled SPD must be a direct photon detector. Unfortunately, the laws of quantum mechanics require that only one electron can be exited by a photon in such devices. Detection of a single photo-generated electron with conventional electronic circuit is not possible, since the input root mean square (hereinafter "rms") noise of the state-of-the-art electronic readout circuits is about 70 electrons at room temperature and at video bandwidths [28]. This means that effective detection of a single photon requires an internal "gain" of about 20 dB for imaging applications, and higher for higher bandwidth applications. Although conventional transistors can readily produce 20 to 30 dB gain at a high bandwidth, they generate a high internal noise as well. The magnitude of the transistor noise depends on the device volume, and thus their sensitivity increases with miniaturization. Consequently, efficient detection of a single electron is possible with a nano-transistor even at room temperature [29-32]. The smaller the capacitance of the device the higher is this sensitivity. For values less than $e^2/2kT$, or about 3 atto-Farads at room temperature, the device can detect a single electron with high reliability [33]. Unfortunately, photon detection has a fundamental problem with miniaturization: the wavelength of the IR radiation is more than several hundred nanometers in semiconductors. Therefore, high optical absorption, required for high quantum efficiency, can only be achieved if the absorbing region of the device is in the micrometer range.

Accordingly, the widespread use of currently existing photodetectors has been limited by the aforementioned drawbacks. Thus, a compact solid-state SPD would gain great relevance in a variety of applications. The present invention, among other things, provides such an SPD that is based on carrier focalization, and carrier augmentation. The carrier focalization is responsible for trapping one of the photo-generated pairs of carriers (electron and hole) as to enhance the photo-generated carrier concentration to a level that affects the electrostatic potential of the SPD, and consequently, its energy band structure. Deformation of the energy band structure would then lead to enhancement of the injection level in a nano-transistor (nano-injector), and therefore carrier augmentation. Thus, the SPD is called a focalized carrier augmented sensor (FOCUS). The SPD operates without the use of avalanche multiplication. The SPD, among other things, possesses unique features absent in the conventional photodetectors. These unique features include, but not limited to:

Zero excess noise due to the lack of bi-carrier multiplication (unlike any avalanche based photodetectors, only one type of carriers are involved in the gain mechanism).

High spatial uniformity over large area arrays, due to a sub-linear gain-voltage relationship in a nano-transistor and nano-resonator used in the SPD.

Quantum efficiency approaching to unity, due to a thick absorbing layer and effective carrier collection and concentration.

Low dark current, due to the very low electric field of about $10^4$ V/cm inside the SPD, and carrier extraction in heterojunctions.

Low photon emission, due to the low electric field and absence of hot carriers.

Efficient carrier concentration leading to a concentration enhancement of about $10^6$ at the nano-switch.

Very high internal gain of about $10^4$, due to the short electron transit time in the nano-switch, and spatial separation of the injected electrons and photo-generated holes.

Fast response time of about 1 ns.

Low noise, due to the low dark current, low capacitance, and zero excess noise.

Operating in the short IR range up to about 1.7 μm with the standard InP-based material, and up to about 3 μm using GaSb-based material system.

The description of the single photon detector in connection with other unique features of the present invention will be made as to the embodiments of the present invention in conjunction with the accompanying drawings in FIGS. 1-15.

Referring to FIG. 1, a photodetector 100 for photon detection is schematically shown according to one embodiment of the present invention. The photodetector 100 includes a multilayered heterojunction structure 110 formed on a substrate 101. In this exemplary embodiment, the multilayered heterojunction structure 110 includes a photon absorption layer 120, a first carrier barrier layer 130 formed on the photon absorption layer 120, a carrier mobile layer 140 formed on the first carrier barrier layer 130, and a second carrier barrier layer 150 formed on the carrier mobile layer 140. The second carrier barrier layer 150 is oxidized to have a carrier barrier region 152, an oxidized region 156 surrounding the carrier barrier region 152, and an edge barrier region 154 surrounding the oxidized region 156. In the embodiment, the carrier barrier region 152 is located at the center of second carrier barrier layer 150 and has a dimension, d, in a scale of nanometers. The dimension d of the carrier barrier region 152 of the second carrier barrier layer 150 is in a range of about 1-500 nm, preferably in a range of 10-200 nm. The first carrier barrier layer 130, the carrier mobile layer 140 and the second carrier barrier layer 150 are configured to form a first energy band structure having a quantum well in the carrier mobile layer 140.

The photon absorption layer 120 having a second energy band structure with a valence band and a conduction band is adapted for generating an electron-hole pair 188 responsive to an incident photon. Accordingly, the photon absorption layer 120 is made from a material capable of absorbing an incident photon and creating an electron-hole pair 188 responsively. The material is either a structured or bulk/unstructured material. The structured material can further be classified as superlattice, quantum well, quantum dot or other structured materials capable of photon absorption characteristics known to the people skilled in the art. For example, the superlattice material utilized to practice the present invention includes one of InAs/GaSb, InAsSb/GaInSb, InAs/AlSb/GaSb, GaInAs/GaAsSb and the likes. The quantum well material utilized to practice the present invention includes one of InGaAs/InP, InGaAsP/InP and the likes. The quantum dot material utilized to practice the present invention includes one of InAs/InP, InAs/InAlAs, InAs/GaAsSb and the likes. The bulk/unstructured materials utilized to practice the

TABLE 1

The following table provides a summary of relevant parameters for the existing detectors with an internal gain compared to the values for the invented SPD Photodetector.

| Device | Quantum Efficiency | Dark Current | Internal Gain | Excess Noise | Array Uniformity | $\lambda_{max}$ |
|---|---|---|---|---|---|---|
| Invented SPD | ~100% | Very Low | ~$10^4$ | None (F~2) | High | $\lambda \geqq 1.7$ μm |
| Silicon APD | 30%-70% | Very Low | $10^5$-$10^6$ | F = 10-50 | Poor | $\lambda \leqq 1.1$ μm |
| InGaAs-Si APD | ~70% | High | 100-500 | F = 10-50 | Poor | $\lambda \geqq 1.7$ μm |
| Heterojunction III-V APD | ~5%-10% | Low | 10-50 | F = 2-3 | Good | $\lambda \geqq 1.7$ μm |
| Quantum-Dot SPD (T < 10° K.) | 1%-2% | Very Low | N/A | N/A | N/A | $\lambda \geqq 1.7$ μm |
| MEMS Micro pin Array | N/A | Very Low | $10^4$ | N/A | Good | $\lambda \leqq 0.2$ μm | present invention include one of GaAs, InP, InGaAs, AlGaAs, GaP, AlN, AlGaInN, GaN, InN, GaAsN, InGaAsP and the likes. Other types of materials can also be used to practice the present invention.

The carrier mobile layer 140 is adapted for transporting one type of carriers of electrons 182 and holes 184. Each of the first and second carrier barrier layers 130 and 150 is adapted for barring the other type of carriers of electrons 182 and holes 184. The carrier mobile layer 130 and the first and second carrier barrier layers 140 and 150 form a quantum well for mobilizing the one type of carriers and repelling the other type of carriers. In one embodiment, the carrier mobile layer 140 is made from a hole transporting material, and each of the first and second carrier barrier layers 130 and 150 is made from an electron barrier material. The first carrier barrier layer 130 is made from a semiconductor material. The second carrier barrier layer 150 is made from a semiconductor material that is same as or different from the semiconductor material of the first carrier barrier layer 130.

The photodetector 100 further includes a first metallic element 162 in contact with the second carrier barrier layer 150 and positioned such that the carrier barrier region 152 of the second carrier barrier layer 150 is between the first metallic element 162 and the carrier mobile layer 140. The first metallic element 162 has a dimension, D, where D>d. The photodetector 100 also has a second metallic element 164 in contact with at least the photon absorption layer 120, and a power source 170 electrically coupled to the first metallic element 162 and the second metallic element 164. The photodetector 100 further includes a substrate 101 on which the photon absorption layer 120 is formed, where the substrate 101 is made from one of a semiconductor material, a metallic material and an insulating material. In this exemplary embodiment, the second metallic element 164 is also in contact with the edge barrier region 154 of the second carrier barrier layer 150 and a portion of the substrate 101. Elements 162 and 164 can be other types of conductive elements in place of metallic elements.

Figure 1B:
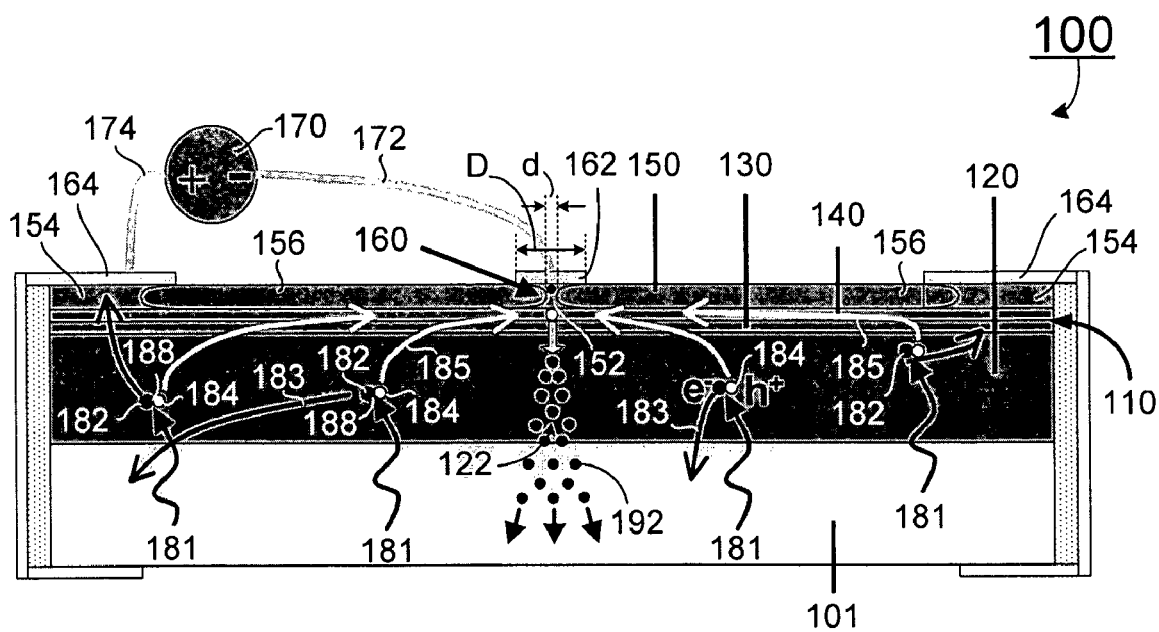

As shown FIG. 1, the photodetector for photon detection according to the present invention is based on two separate mechanisms: carrier focalization, and carrier augmentation. The carrier focalization is responsible for enhancing the photo-generated carrier concentration to a level that affects the electrostatic potential of the SPD device, and consequently, its energy band structure. Deformation of the energy band structure would then lead to enhancement of the injection level in a nano-transistor (nano-injector), and hence carrier augmentation. In this exemplary embodiment shown in FIG. 1, the carrier mobile layer 140 is corresponding to a hole mobile layer or a hole channel and the first and second carrier barrier layers 130 and 150 are corresponding to an electron barrier layer. As shown in FIG. 1B, photo-generated holes 184 across the electron barrier layer 130 are focused to the center 142 of the hole channel 140, due to a lateral electric field. Meanwhile, holes 184 are trapped and transported in the vertical direction through a hole channel 140. The combined mechanism produces an extremely high concentration factor, about $10^7$, in a small volume under the nano-injector 160. The effective three-dimensional confinement leads to an effective quantum dot under the carrier barrier region.

Figure 1C:
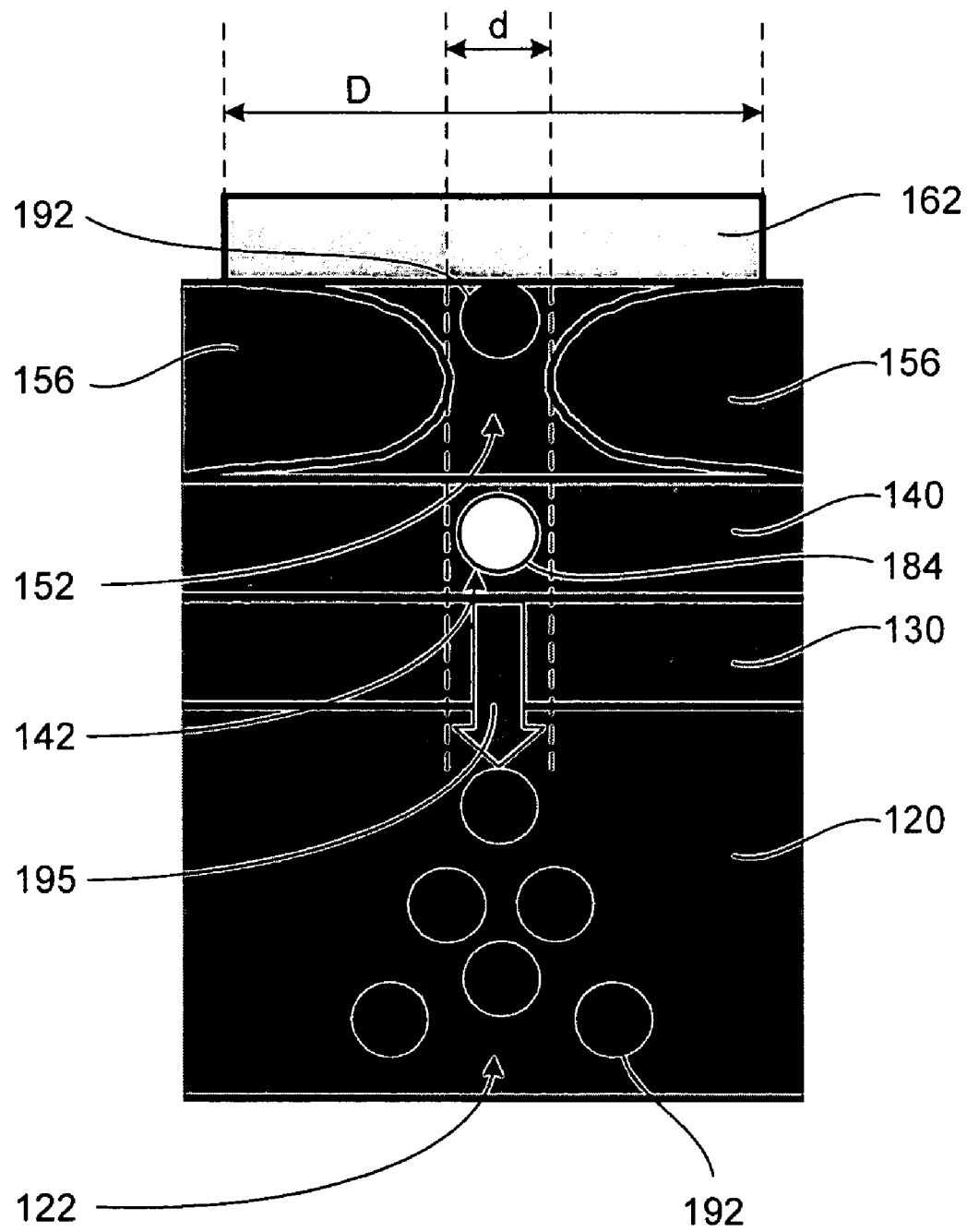

Specifically, when a voltage (not shown) is applied to the first metallic element 162 and the second metallic element 164 from the power source 170, an electric field is established with a lateral component and a vertical component and a stream of electrons 192 move into the carrier barrier region 152 from the first metallic element 162. When a photon 181 is incident to the photon absorption layer 120, an electron in the photon absorption layer 120 absorbs the photon to transit from the valence band to the conduction band and a hole is generated in the valence band in response, thereby forming an electron-hole pair in the photon absorption layer 120. The photo-generated electron-hole pair 188 is spatially separated in the photon absorption layer 120. For example, as shown in FIG. 1B, the electron 182 moves along a path 183, while the hole 184 propagates along a path 185. Due to the established electric field in the multilayered heterojunction structure 110, the separated photo-generated hole 184 is transported into the hole mobile layer 140, moves along the hole mobile layer 140 towards a volume 142 of the hole mobile layer 140 located under the nano-injector 160 and trapped therein. The volume 142 is effectively a quantum dot that confines the hole 184, and in general is in a very small volume, in dimensions of nanometers. The single hole 184 confined in such a small volume produces a very high electrostatic potential or charge density therein, which in turn, results in deformation (decrease) of barrier potentials of the barrier layer 130 and 150 for electrons. Therefore, the electron injection level is heavily affected by the existence of a single trapped hole 184. Consequently, the existence of a single trapped hole 184 in the volume 142 enhances a rate of the injected electrons 192 tunneling through the volume (quantum dot) 142 of the hole mobile layer 140 into the photon absorption layer 120, resulting in a measurable increase of a corresponding electric current. Each of the stream of electrons 192 moves towards to the second metallic element 164 from the first metallic element 162 unless it is recombined with the trapped hole 184 in the volume 142, or until the trapped hole 184 is thermally exited and leaves the volume 142. As shown in FIGS. 1B and 1C, after tunneling through the volume 142, the injected electron 192 are augmented in a limited region 122 of the photon absorption layer 120 located underneath the volume 142 of the carrier mobile layer 140. This ensures the injected electrons 192 in the photon absorption layer 120 not to recombine with the photo-generated holes 184 in the photon absorption layer 120 before they are transported and trapped in the volume (quantum dot) 142. These electrons in the photon absorption layer 120 including the photo-generated electrons 182 and the injected electrons 192 after tunneling through the hole channel (quantum well) 140 are recycled into the carrier source 170 through the second electrode 164 of the nano-injector 160.

The trapped hole 184 in the volume 142 has a lifetime, Th, and the injected electrons 192 have a transition time, $\tau_{tran}$, for tunneling through the volume 142, where $\tau_h \gg \tau_{trans}$, which in one embodiment, produces a substantial gain in a range of about $10^3$ to $10^4$.

Figure 2:
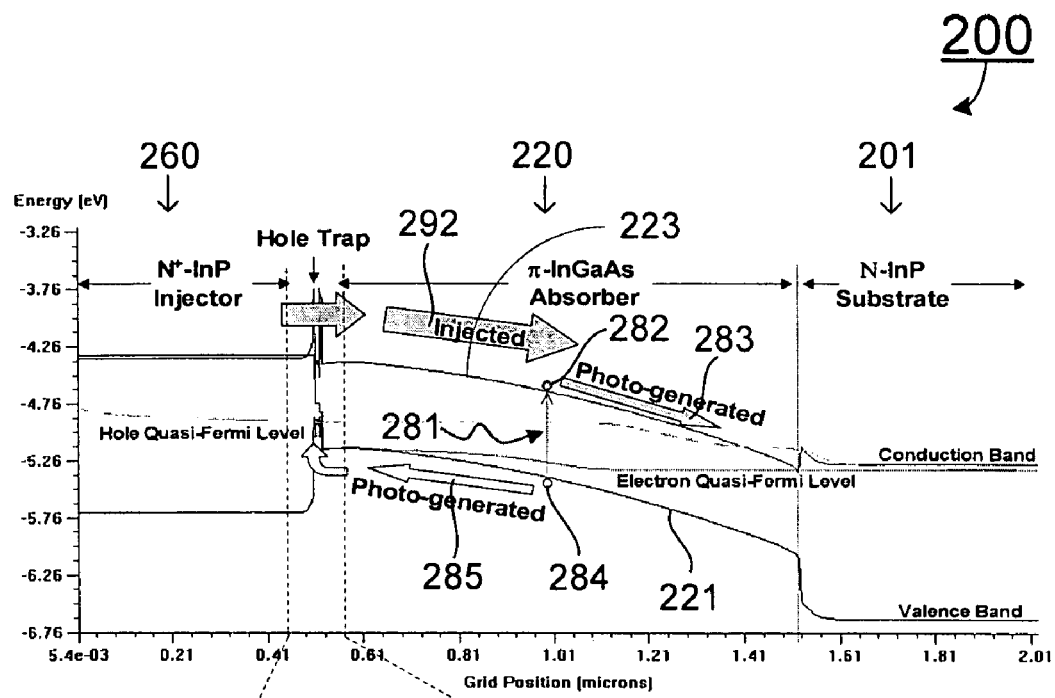
FIG. 2 shows schematically an energy band structure of a single photon detector according to one embodiment of the present invention, (A) and (B) an energy band structure at the center of the single photon detector.
Figure 2:
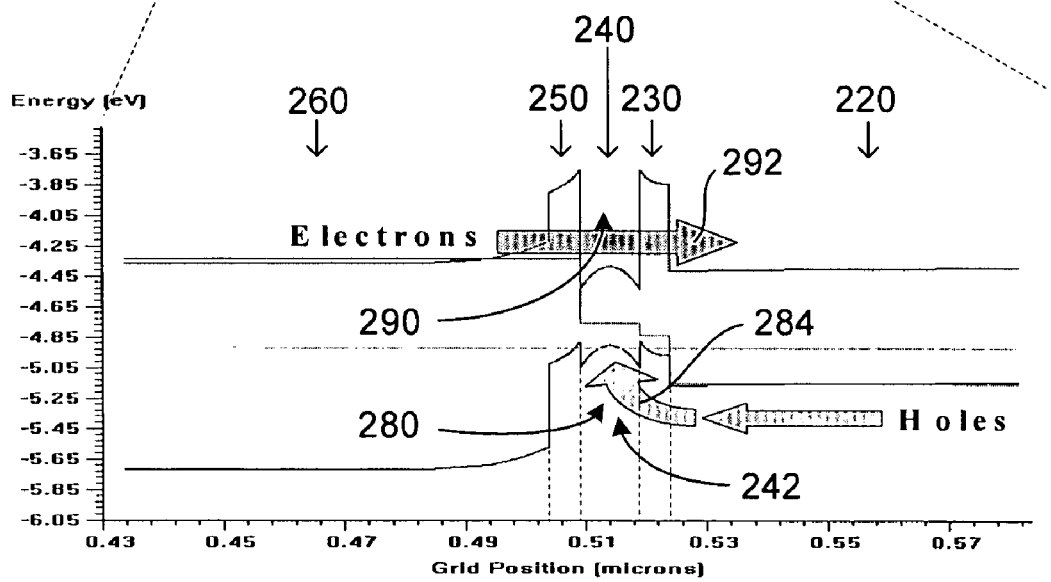

Referring to FIG. 2, an energy band structure 200 of a multilayered heterojunction structure used for a photodetector for photon detection is shown according to one embodiment of the present invention. In this embodiment, the photodetector also includes a layer of N⁺—InP positioned between the first metallic element and the carrier barrier region. The absorption layer 220 is formed of π-InGaAs, and the substrate 201 is formed of N—InP. The electron barrier layers 230 and 250 are formed of AlInAs.

The energy band structure 200 is aligned to form a quantum well having a conduction band potential well 290 and a valence band potential well 280 under the nano-injector, such that the holes 284 are deeply trapped a volume (quantum dot) under the nano-injector and cannot tunnel through it. As shown in FIG. 2, when a photon 281 is incident to the photon absorption layer 220, an electron 282 in the photon absorption layer 220 absorbs the photon 281 to transit from the valance band 221 to the conduction band 223 and a hole 284 is generated in the valence band 221 in response, thereby forming an electron-hole pair in the photon absorption layer 220. The electron-hole pair is spatially separated into an electron 282 and a hole 284. The photo-generated hole 284 is focalized and trapped in volume (quantum dot) 242. The single hole 284 confined in such a small volume 242 produces a very high charge density therein, which results in deformation of barrier potentials of the barrier layer 230 and 250 for electrons, thereby enhancing a rate of the injected electrons 292 tunneling through the volume (quantum dot) 242 into the photon absorption layer 220.

The energy band structure 200 of the multilayered heterojunction structure shown in FIG. 2, is corresponding to a type II band alignment, such a superlattice, which is crucial for hole confinement. A superlattice comprises a structure having a plurality of periodically interchanging layers. In a superlattice, electrons are confined in one layer and holes in the other, that is the spatial separation of the electrons and holes in a superlattice. This phenomenon is a unique feature of this band alignment and is due to the separation of the electron and hole potential wells. As a result of such spatial separation, a huge internal electrical field exists in the junction without any doping or hydrostatic pressure. In addition, the superlattice has other unique features including high lateral to vertical mobility ratio, long carrier lifetime, wide bandgap tuning range, and high optical absorption coefficient. Therefore, a superlattice having such an energy band structure can be utilized to practice the present invention. Superlattice photon detectors are based on interband optical transitions and thus they can operate at much higher temperatures.

Figure 3:
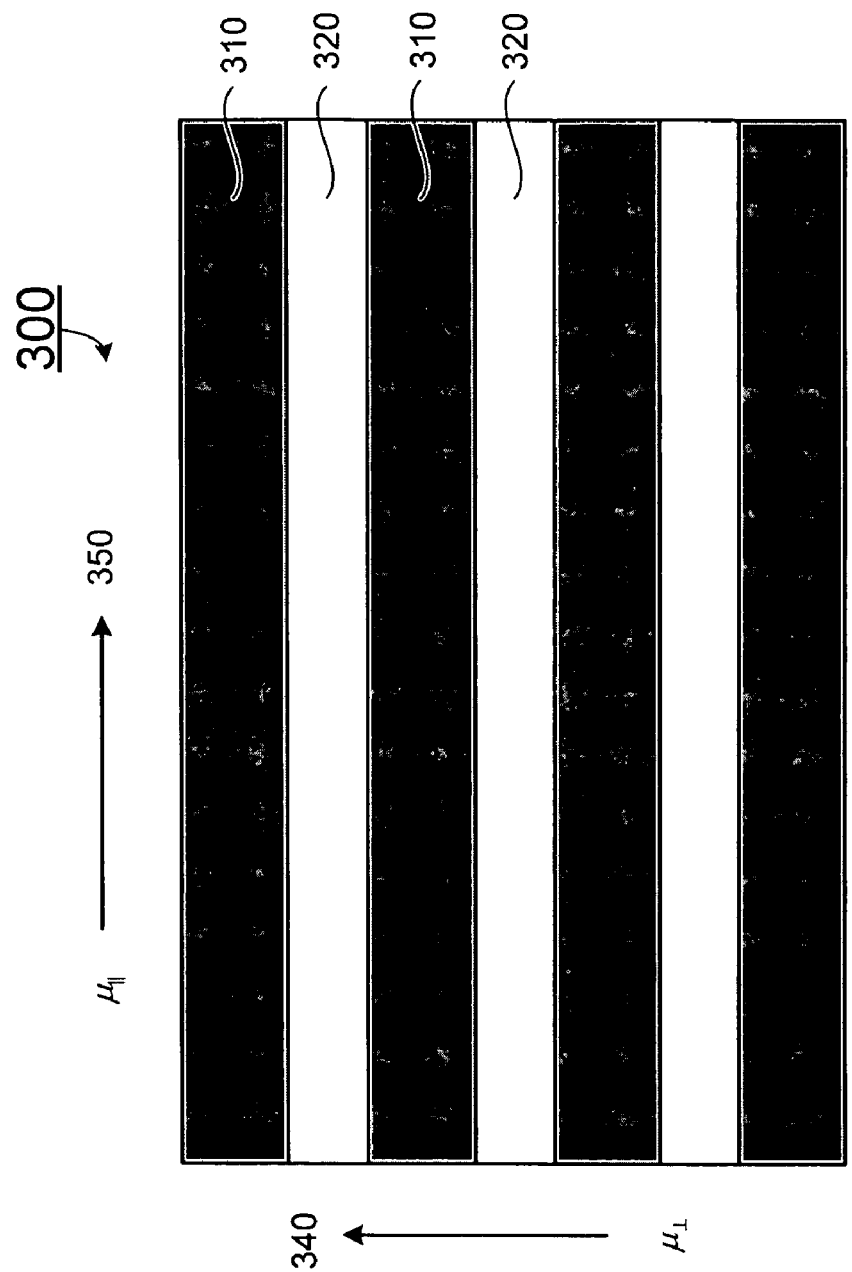
FIG. 3 shows schematically a cross-sectional view of a type II superlattice.

Referring to FIG. 3, a type II superlattice 300 having a plurality of periodically interchanging layers 310 and 320 is schematically shown. The type II superlattice 300 has a vertical carrier mobility, $\mu_\perp$, along a direction 340 perpendicular to periodically interchanging layers 310 and 320 and a lateral carrier mobility, $\mu_\parallel$, along a direction 350 parallel to the periodically interchanging layers 310 and 320, where $\mu_\parallel \gg \mu_\perp$. The plurality of periodically interchanging layers 310 and 320 forms at least one quantum well capable of mobilizing one type of carriers and repelling the other type of carriers. Such a type II superlattice 300 is capable of spatially separating an photo-generated electron-hole pair into an electron and a hole in one layer, transporting one of the electron and the hole of the photo-generated electron-hole pair into another layer, focalizing it along the another layer into a desired volume and trapping it therein, the desired volume having a dimension in a scale of nanometers. In one embodiment, the type II superlattice has a dimension in a scale of micrometers in order to detect an IR photon.

Figure 4:
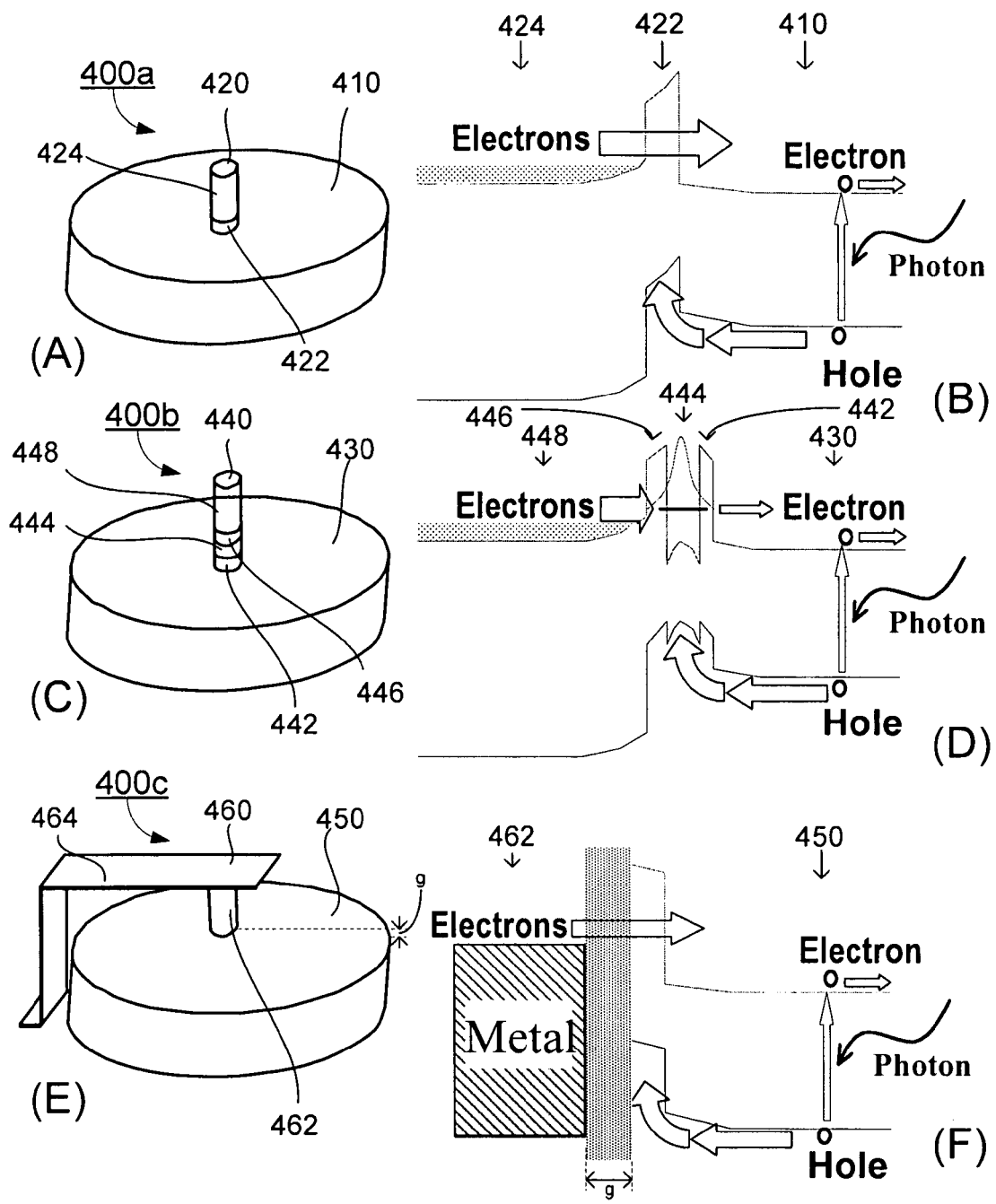
FIG. 4 shows schematically three nano-injectors and their principal of operation according to embodiments of the present invention, (A) and (B) a nano-transistor, (C) and (D) a nano-resonator, and (E) and (F) a nano-electromechanical switch.

Referring to FIG. 4, a nano-transistor, a nano-resonator, and a nano-electromechanical switch are schematically shown according to embodiments of the present invention.

As shown in FIG. 4A, the nano-transistor 400a has a photon absorption member 410 and a carrier injecting member 420. The carrier injecting member 420 has a first layer 422 formed on the photon absorption member 410 and a second layer 424 formed on the first layer 410 and adapted for injecting carriers, for example, electrons according to the exemplary embodiment shown in FIGS. 4A and 4B, from the second layer 424 into the photon absorption member 410. The photon absorption member 410 and the first and second layers 422 and 424 are configured to have an energy band structure shown in FIG. 4B, such that when a photon is incident to the photon absorption member 410, an electron-hole pair is generated therein responsively, and the hole of the photo-generated electron-hole pair is transported and trapped into the first layer 424 so as to enhance the concentration of the hole therein to cause deformation of the energy band structure (FIG. 4B), thereby enhancing a rate of injected carriers tunneling through the first layer 422 into the photon absorption member 410. The photon absorption member 430 has a dimension in a scale of micrometers, which is essential for detecting IR photons. The carrier injecting member 420 has a dimension in a scale of nanometers, preferably, less than 500 nm. As shown in FIG. 4B, the energy band structure of the nano-transistor 400a is corresponding to a type II band alignment.

FIG. 4C shows schematically a nano-resonator 400b that includes a photon absorption member 430 and a carrier injecting member 440 having a first layer 442 formed on a photon absorption member 430, a second layer 444 formed on the first layer 442, a third layer 446 formed on the second layer 442, and a fourth layer 448 formed on the third layer 446.

The photon absorption member 430 and the first to fourth layers 442, 444, 446 and 448 are configured to have an energy band structure shown in FIG. 4D such that when a photon is incident to the photon absorption member 430, an electron-hole pair is generated therein responsively, and the hole of the photo-generated electron-hole pair is transported and trapped into the second layer 444 so as to enhance the concentration of the carriers such as holes therein to cause deformation of the energy band structure (FIG. 4D), thereby enhancing a rate of injected electrons tunneling through the second layer 444 into the photon absorption member 430.

The photon absorption member 430 has a dimension in a scale of micrometers, which is essential for detecting IR photons. The carrier injecting member 440 has a dimension in a scale of nanometers, preferably, less than 500 nm. The energy band structure of the nano-resonator 400b as shown in FIG. 4D is corresponding to a type II band alignment.

As shown in FIG. 4E, the nano-electromechanical switch 400c comprises a photon absorption member 450 and a carrier injecting member 460 having a nano-tip 462 positioned above the photon absorption member 450 to define a gap therebetween for injecting carriers (for instance, electrons) into the photon absorption member 450. The photon absorption member 450 and the nano-tip 462 are adapted such that when a photon is incident to the photon absorption member, an electron-hole pair is generated therein responsively, and the hole of the photo-generated electron-hole pair is transported and trapped in a volume underneath the nano-tip 462, which enhances a rate of injected electrons from the nano-tip 462 tunneling through the gap into the absorption member 450. The gap has a gap width, g, that is variable. The photon absorption member 450 has a dimension in a scale of micrometers.

One aspect of the present invention relates to an array formed with a plurality of nano-transistors or nano-resonators, as described above.

Another aspect of the present invention provides a photodetector for single-photon detection. The photodetector in one embodiment includes a photon absorption region and a carrier trapping region and configured to have an energy band structure such that when a photon is incident to the photon absorption region, an electron-hole pair is generated in the photon absorption region responsively, and one of the electron and hole of the photo-generated electron-hole pair is transported and focalized into the carrier trapping region so as to enhance the concentration of the corresponding carrier therein to a level that affects the electrostatic potential of the sensor, thereby deforming the energy band structure of the sensor, which leads to the enhancement of the flow of external injected carriers through the carrier trapping region, resulting in a measurable increase of a corresponding electric signal.

The external injected carriers are complementary to the one of the electron and the hole focalized in the carrier trapping region, and input to the sensor by a nano-injector having a dimension in a scale of nanometers. In one embodiment, the sensor has a type II heterojunction structure capable of spatially separating an electron-hole pair into an electron and a hole generated in one region responsive to an incident photon, transporting and focalizing one of the electron and hole of the photo-generated electron-hole pair into another region.

Yet another aspect of the present invention provides an apparatus for photon detection. In one embodiment, the apparatus has a plurality of photodetectors. The plurality of sensors is spatially arranged in the form of an array, or a matrix. Each sensor is disclosed above.

A further aspect of the present invention provides a method for photon detection. In one embodiment, the method includes the steps of providing at least one photodetector having a photon absorption region and a carrier trapping region and an energy band structure with a quantum well; generating an electron-hole pair in the photon absorption region of the at least one photodetector responsive to an incident photon, where the electron-hole pair is spatially separated upon interaction with the energy band structure into an electron and a hole; establishing an electric field with a lateral component and a vertical component, where the lateral component of the electric field causes the hole to move towards the carrier trapping region and be trapped therein, thereby deforming the energy band structure to enhance a rate of electron tunneling through the carrier trapping region, resulting in a measurable increase of a corresponding electric signal; and measuring the measurable increase of a corresponding electric signal to detect the incident photon. The photon absorption region of the at least one photodetector has a dimension in a scale of micrometers, and the carrier trapping region of the at least one photodetector has a dimension in a scale of nanometers. In one embodiment, the establishing step comprises the step of injecting electrons into the at least one photodetector.

Yet a further aspect of the present invention provides methods for fabricating single-photon detector, which are described below in details.

Briefly, a SPD device for single photon detection according to the present invention includes a photon absorbing and charge compression region and a nano-injector (nano-switch) coupled to the photon absorbing and charge compression region. The dimension of this region is in a range of micrometers, in order to absorb IR photons effectively. This region is formed to have an internal electric field to separate the electron-hole pairs and prevent their recombination before detection. The overall electrostatic potential of this region is such that it condenses one of the photo-generated pair (holes, for example) and transfer them to a nano-switch efficiently. The dimensions of the nano-injector is in a range (scale) of nanometers, in order to be sensitive to a single electron (or hole) and produce a change of potential above the thermal fluctuation level at or near room temperature. In practice, although injector contact (electrode) of the nano-injector is about 0.2 µm in dimension, controlled lateral oxidation of an AlInAs layer is used to reduce the injector dimension to about 100 nm. The large potential barrier of the oxide reduces the effective dimension of the nano-injector to about 50 nm.

Note that high optical absorption can be obtained by placing a large number of nanometer size absorbers densely. In fact, quantum dot infrared photodetectors (QDIP) with dot surface density above $10^{10}/cm^2$ show admirable quantum efficiencies [34-36]. However, for a single absorbed photon in a QDIP, there is only one dot that will eventually confine the single generated electron, and the rest will contribute to a large amount of noise. This example underlines the importance of separation of the absorption region and the nano-switch.

These unique features make the single-prism pulse compressor ideal for essentially all ultrafast optical applications, and especially for multi-photon imaging and nano-machining.

These and other aspects of the present invention are further described below.

EXAMPLES AND IMPLEMENTATIONS OF THE INVENTION

Without intent to limit the scope of the invention, exemplary methods and their related results according to the embodiments of the present invention are given below. Note again that titles or subtitles may be used in the examples for convenience of a reader, which in no way should limit the scope of the invention. Moreover, certain theories are proposed and disclosed herein; however, in no way they, whether they are right or wrong, should limit the scope of the invention.

According to the present invention, a single-photon detection in the SPD device is based on two separate mechanisms: carrier focalization, and carrier augmentation. The carrier focalization is responsible for enhancing the photo-generated carrier concentration to a level that affects the electrostatic potential of the SPD device, and consequently, its energy band structure. Deformation of the energy band structure would then lead to enhancement of the injection level in a nano-transistor (nano-injector), and hence carrier augmentation.

Carrier Focalization

Figure 5:
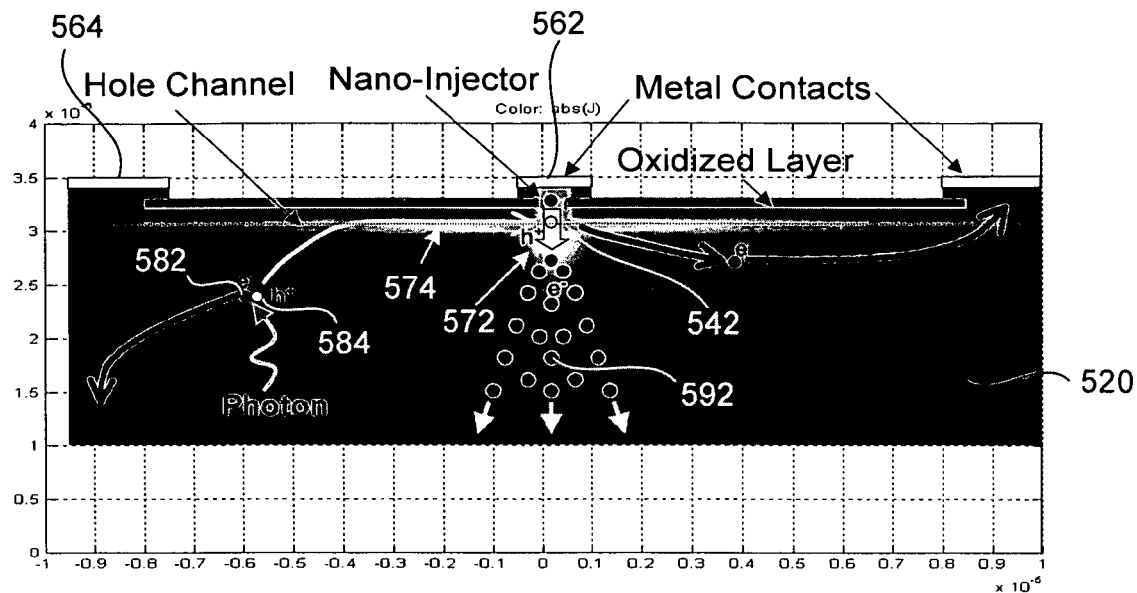
FIG. 5 shows a two-dimensional simulation of the current density inside a single photon detector according to one embodiment of the present invention.

As disclosed above, the carrier focalization leads to potential deformation, only if it is selective for one type of carriers: electrons or holes. For a SPD device according to the present invention, two mechanisms are utilized to concentrate holes to an extremely small volume under the nano-injector. When a voltage (not shown) is applied to the first metallic element 562 and the second metallic element 564 from the power source (not shown), an electric field is established with a lateral component 574 and a vertical component 572 and a stream of electrons 592 move into the carrier barrier region 552 from the first metallic element 562. The electrons may also be injected from other sources. The lateral component 574 of the electric field causes the hole to move towards a volume of the carrier mobile layer underneath the carrier barrier region and be trapped therein, thereby deforming the first energy band structure to enhance a rate of the stream of electrons tunneling through the volume of the carrier mobile layer into the photon absorption layer, resulting in a measurable increase of a corresponding electric signal. As shown in FIG. 5, when an incident photon 581 is absorbed in the absorption layer 520, an electron-hole pair 588 is generated. The photo-generated hole 584 is first accumulated in a quantum "hole-channel" located above the absorbing layer 520. This is due to the vertical electric field of about $10^4$ V/cm, and a hole carrier diffusion length of several micron at room temperature in this material. Although holes have a mobility of about 200 $cm^2$/Vsec in $Ga_{0.47}In_{0.53}As$, their velocity is about $2 \times 10^6$ cm/sec with the above field, and hence the transit time for the holes to reach the hole channel is less than 50 ps.

FIG. 5 also shows a two-dimensional (2D) simulation of the current density of the SPD device under illumination, where lateral transportation through the quantum well is evident. Once the holes 581 are trapped under the nano-injector, the potential barrier for electrons decreases, and the hot electrons 592 are injected from an N+-doped injector. For such an SPD device, there are a high lateral current density 574 in the hole channel, which is due to the lateral hole focalization and a high vertical current density 572 at the quantum dot under the nano injector, which is due to the electron injection. Note that the injected electrons 592 are focused in the very center of the SPD device, and do not affect the electron density in about 99% of the device volume. This feature ensures that the majority of photo-generated holes 584 does not see a high electron density, and does not recombine before reaching the trap.

When the injected electrons tunnel through the thin barriers, the transition time, $t_{trans}$, for the electrons which is estimated from the tunneling probability and current continuity, is about $4\times10^{-13}$ s. However, the trapped hole lifetime, $\tau_h$, in the trap is about $1\times10^{-9}$ s. This results in a gain of about 1800, which is close to the expected value of $\tau_h/t_{trans}$.

Figure 6:
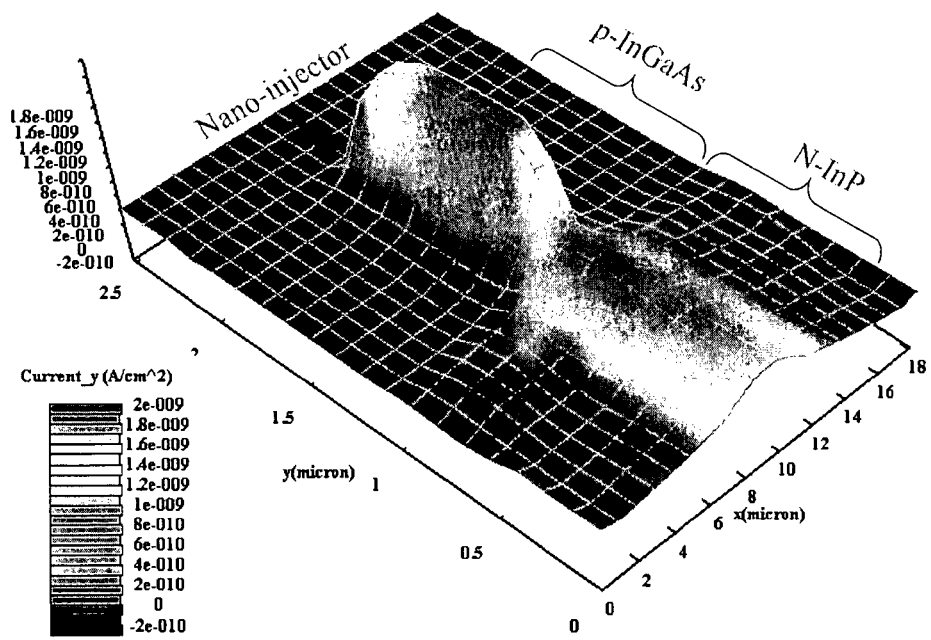
FIG. 6 shows a three-dimensional simulation of the current density inside a single photon detector according to one embodiment of the present invention.

Referring to FIG. 6, a numerical simulation of the SPD device according to one embodiment is shown. Once holes are transported into the hole channel, the holes accelerate in the lateral direction along the hole channel towards the center of the SPD device with an average velocity of ~$4\times10^6$ cm/sec that leads to a maximum transit time of about 250 ps. The electron concentration in this region is less than $10^{16}$ cm$^{-3}$, since the electron injections are mainly below the nano-injector and represent less than 1% of the volume of the absorbing layer. The low electron density leads to a hole lifetime of $\tau_h$>100 ns and the charge transfer efficiency ($1-\tau_h/t_{transit}$) is near unity. This efficient charge transfer combined with a thick InGaAs absorbing layer, about 1 µm in the simulations, (but it can be several microns), results in an internal quantum efficiency (before gain) of nearly 100%. Therefore, nearly all photo-generated holes accumulate at the hole trap under the nano-injector. The volume of the trap is about $5\times10^{-17}$ cm$^{-3}$, compared to about $4\times10^{-10}$ cm$^{-3}$ for the volume of the absorbing layer. This represents a carrier concentration enhancement of nearly $10^7$. As described below, such a large concentration factor is a crucial part of the gain mechanism in the disclosed SPD device.

Figure 7:
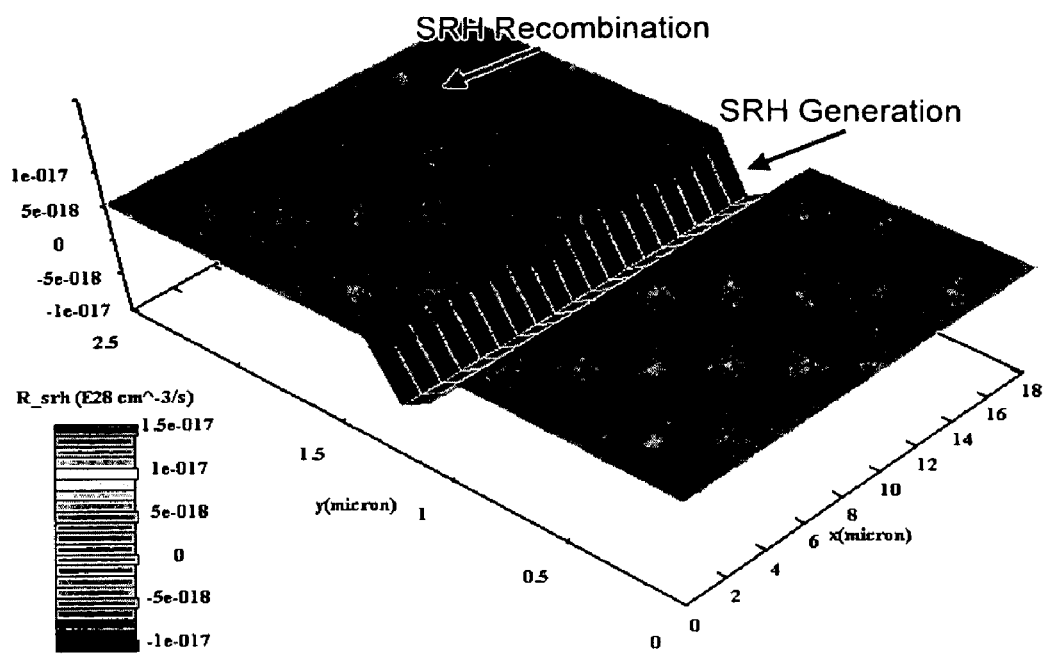
FIG. 7 shows a Shockley Read Hall (SRH) generation and recombination rates of a single photon detector according to one embodiment of the present invention.

Another important feature of the SPD device of the present invention is the extremely low dark current due to a weak SRH generation rate. The SHR is a non-equilibrium source of dark current that will increase at highly depleted layers. The lack of need for a high electric field leads to a partly depleted absorber, and low SRH rates, as shown in FIG. 7.

Figure 8:
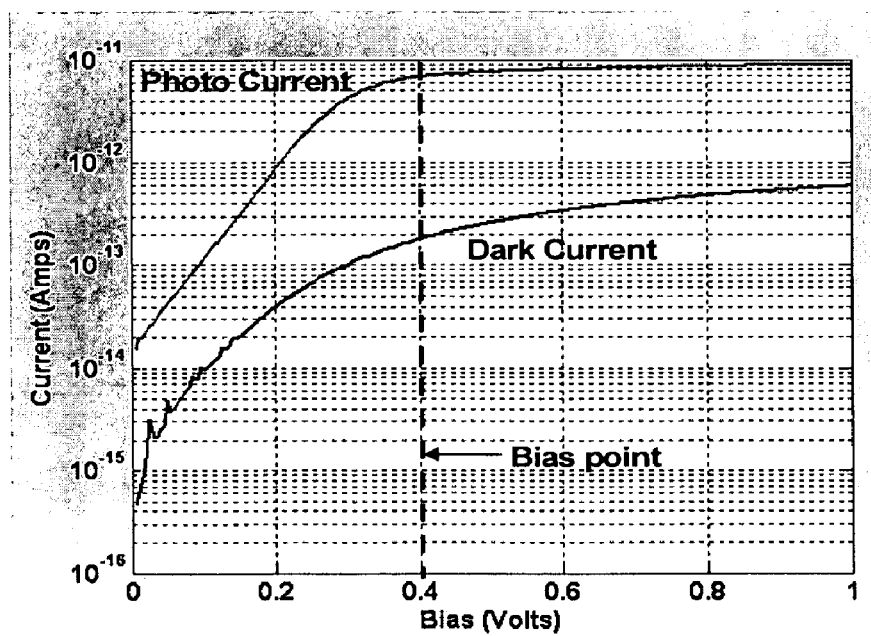
FIG. 8 shows a simulated dark current and photocurrent of a single photon detector according to one embodiment of the present invention.

The simulated dark current and photocurrent are shown in FIG. 8, where a sublinear relation between the bias and the device gain is shown. The SPD device shows a gain of about 1800 at a bias of about 0.4 volts.

Carrier Augmentation:

Accumulated holes under the nano-injector affect the electrostatic potential of the material such that the energy band shifts to the lower values. This reduces the barrier height for the electrons, which are the majority carriers, and their level of injection. Since the electron tunneling based injection is exponentially related to the barrier height, a small change leads to a significant change of injection, which is similar to resonant tunneling diodes (RTDs). The injected electrons tunnel through the thin barriers. The transition time for the electrons, estimated from the tunneling probability and current continuity, is about $t_{trans}$~$4\times10^{-13}$ s. The hole lifetime in the trap is $\tau_h$~$1\times10^{-9}$ s. The numerical simulation shows a gain of about 1800, which is close to the expected value of $\tau_h/t_{trans}$.

Figure 9:
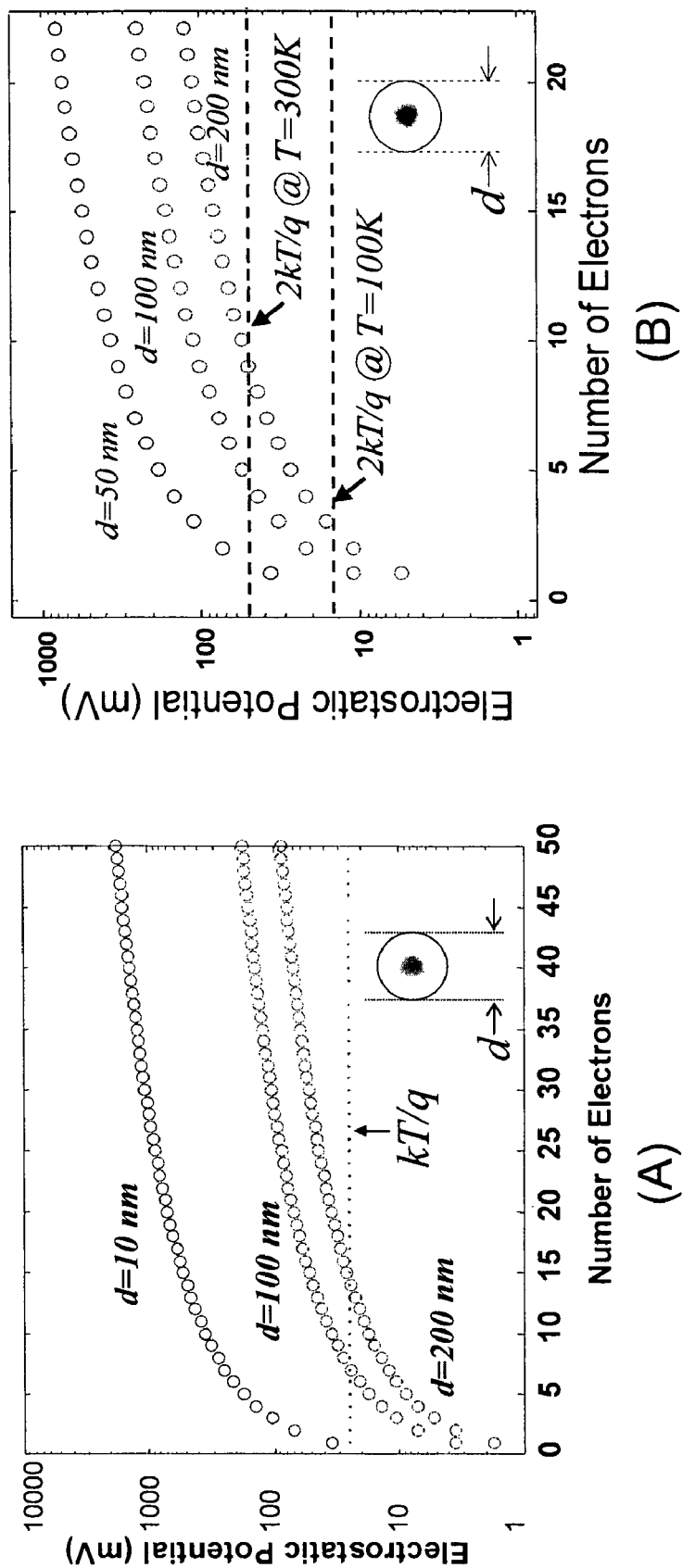
FIG. 9 shows deformation potentials (A) and (B) as a function of the number of electrons in a nano-injector with different dimensions, d, of a single photon detector according to one embodiment of the present invention.
Figure 10:
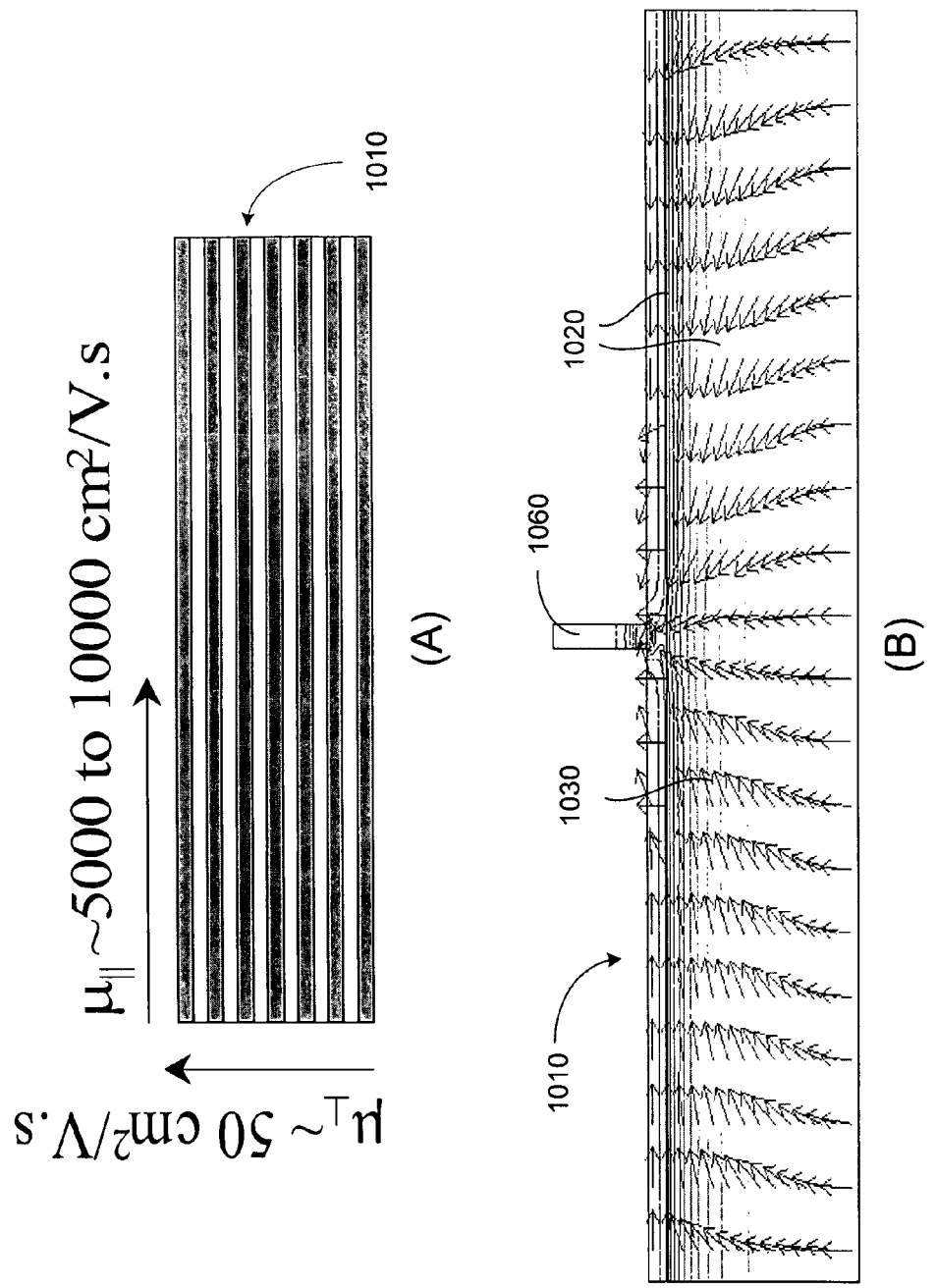
FIG. 10 shows (A) values of electron mobility parallel and perpendicular to type-II superlattice interfaces, (B) a two-dimensional simulation of a single photon detector according to one embodiment of the present invention, showing charge concentration (arrows) towards the nano-injector, even as the potential contours (lines) show a small lateral electric field.

Referring to FIG. 9, the change of the electrostatic potential of the nano-injector versus the number of the trapped holes is shown, which is calculated from the quantum self-capacitance of the SPD device of the present invention [45]. FIG. 9 shows the calculated change of the potential as a function of the number of electrons in the nano-injector with different dimension d. The potential variation is compared with the thermal fluctuation at room temperature as the main source of the electron energy spreading. It is clear that for a device with a 100 nm dimension, existence of about 7 holes (or electrons) can be detected above the thermal fluctuation.

The detection limit is about 1 hole (or electron) for the SPD device with about 10 nm nano-injector, as shown in FIG. 9A.

FIG. 9b shows such a calculation of the potential for a SPD device having a 10 nm thick, comparing with the thermal fluctuation level (noise) at T=300 K and T=100 K. This calculation shows that the dimension of the quantum dot needs to be about 50 nm, in order to achieve single electron detection at room temperature, while a dimension of about 100 nm is sufficient at T=100 K. These dimensions are readily accessible using a deep UV and E-beam lithography.

Photon Absorption and Charge Compression in Type-II Superlattices

According to the present invention, photo-generated holes across an SPD device are focused to the center of the SPD device, due to the lateral electric field. Meanwhile, holes are trapped and transported in the vertical direction through a hole channel near the top surface of the SPD device. The combined mechanisms produce an extremely high concentration factor under the nano-injector, which is about $10^6$. This can be utilized by using type-II superlattices since they can uniquely provide the following features:

High lateral to vertical mobility ratio: Anisotropic carrier mobility improves lateral charge compression significantly. The minimum lateral dimension of a pixel in an arrayed IR detector is about 15-30 µm, and is dictated by the area required by a readout integrated circuit (ROIC). However, the vertical dimension must be about the optical absorption length or 1-2 µm. The simulation results according to one embodiment of the present invention show that the lateral field far from the center of the SPD device is relatively weak. Under these conditions, a high lateral to vertical mobility ratio ensures that photo-generated carriers that are far from the center of the SPD device find their ways to the center. Referring to FIG. 10B, a 2D simulation of the SPD device including a type II superlattice 1010 and a nano-injector 1060 formed on the center of the type II superlattice 1010 is shown according to one embodiment of the present invention. It is evident that carriers, for example, holes, move towards the center under the nano-injector 1060, which are indicated by arrows 1030, and consequently carriers are concentrated at the center. Additionally, a small lateral electric field also exists in the type II superlattice 1010, which is represented by the potential contour lines 1020. As shown in FIG. 10A, the lateral mobility, $\mu_\parallel$, of electrons in a type II superlattice 1010 is in a range of about 5000 to 10000 cm$^2$/V s, however, the vertical mobility, $\mu_\perp$, of electrons is about 50 cm$^2$/V s. The lateral (parallel) to vertical (perpendicular) mobility ratio, $\mu_\parallel/\mu_\perp$ of more than two orders of magnitude in the type-II superlattice for both electrons and holes [37, 38, 88]. Such a high lateral to vertical mobility ratio is the key to the high efficiency of the charge compression scheme in the SPD device according to the present invention. The simulation results indicate that the photo-generated carriers across the type-II superlattice absorption layer are transferred to the nano-switch with high efficiencies approaching to unity. The reason for efficient charge transport to the nano-switch region is the high lateral charge mobility that leads to high carrier velocities in the order of about $10^6$-$10^7$ cm/s even for a small electric field of about $10^4$ V/cm. Therefore, the carriers transition time across the SPD device, $t_{trans}$, is only a few tens of picoseconds.

Long carrier lifetime: Type-II superlattices provide another important feature, namely a very high carrier lifetime $\tau_{e-h}$. This is mainly due to the spatial separation of the electron and hole wavefunctions in the material and suppression of Auger recombination [38, 89]. The lifetime in type-II superlattices is about 130 ns at room temperature at cutoff wavelength of $\lambda_c$~5 µm [40], compared with about 50 ns from bulk InSb with $\lambda_c$~5 µm at room temperature [41], about 17 ns at room temperature at $\lambda_c$~10 µm, and about 500 ps at T=80 K for $\lambda_c$~20 µm [42]. Long carrier lifetimes lead to high charge transfer efficiency, since the ratio of transition time to recombination lifetime $t_{trans}/\tau_{e-h}$ provides an estimate for the fraction of carriers that recombine before they reach the nano-switch region. The simulation results, based on a commercial simulation tool [43], for the SPD device according to one embodiment of the present invention, show a charge transfer efficiency of more than 95%.

Figure 12:
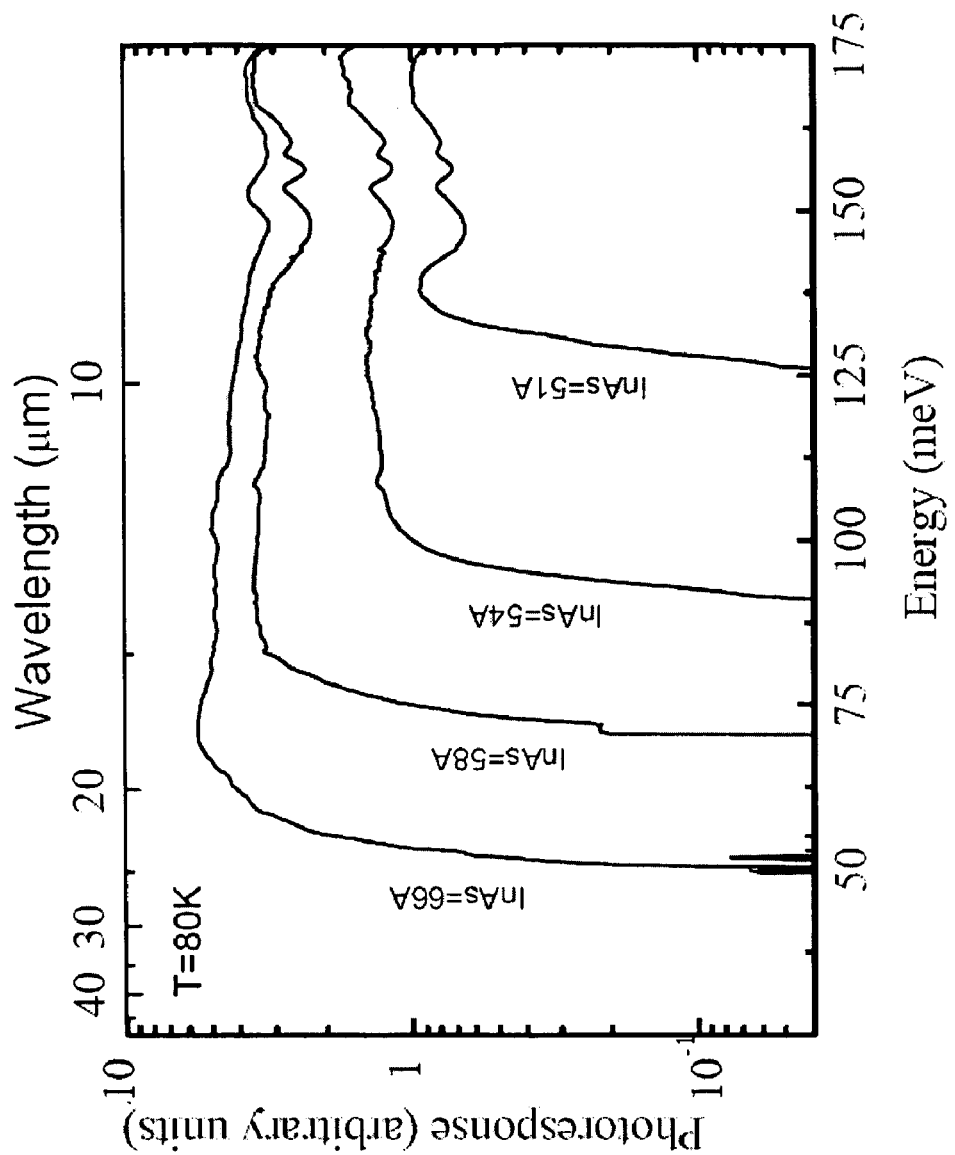
FIG. 12 shows changes of the absorption edge of a type-II superlattice by adjusting the layer thickness.

Wide bandgap tuning range: Another important feature of type-II superlattices is that their effective bandgap can be changed from short to long IR range, simply by changing the layer thickness [90], as shown in FIG. 12.

High optical absorption coefficient: Type-II superlattices also have a high optical absorption for normal incident light, unlike quantum well infrared detector (QWIP), which is similar to the optical absorption of the best direct gap III-V and II-VI semiconductors [38, 44].

Electron or hole only channel: The unique band alignment of type-II heterojunctions makes it possible to form a quantum well or conductive "channel" for only one type of carriers, electrons or holes, while "repelling" the other type. In one embodiment of the present invention, a hole channel, for instance, is constructed at the top of an absorbing layer to help transferring the holes to the nano-switch efficiently. Note that the hole channel is also a part of the nano-switch at the center of the SPD device, and provides a tunnel barrier for electron injection in this device.

Nano-Switch (Nano-Injector)

The function of a nano-switch is to detect the presence of a single charge (holes for instance), and produce an electrical signal that is significantly higher than the noise. As disclosed above, this can only be achieved by confinement of the photo-generated carrier into a nanometer size area (volume). According to the present invention, the generation of the electrical signal however, can be accomplished through different mechanisms, for example, by utilizing a nano-transistor, a nano-resonator, and/or a nano-electromechanical switch, as shown in FIG. 4. All three methods provide a high gain and a high sensitivity required for the detection of a single photon, while having frequency bandwidths above tens of megahertz. Without limit to the scope of the invention, the principle of operation of the nano-transistor, as well as the general advantages of the nano-resonator and nano-electromechanical switch are described briefly as follows.

Nano-Transistor: This is the most commonly used method for detection of a single electron or hole at room temperature [29-32]. Assuming a given thickness for the quantum dot, one can calculate the electrostatic deformation potential versus quantum dot dimension and number of trapped electrons using quantum self-capacitance of the dot [45]. As shown in FIG. 9B, such a calculation for a 10 nm thick device is shown, which is compared with the thermal fluctuation level (noise) at T=300 K and T=100 K. This calculation shows that the dimension of the dot needs to be about 50 nm, in order to achieve single electron detection at room temperature, while a dimension of about 100 nm is sufficient at T=100 K. These dimensions are readily accessible using a deep UV and E-beam lithography. In principle, the trapped hole (or electron) at the nano-transistor affects the electrostatic potential of the material through the so-called Coulomb blockade [46] such that the energy band shifts to lower (upper) values. This reduces the barrier height for the electrons (holes), and significantly increases their level of injection. The transition time for the electrons, estimated from the tunneling probability and current continuity, is extremely short and only about $t_{trans}$~$4 \times 10^{-13}$ sec. This leads to a high current gain, as the injected electrons re-circulate through the SPD device many times before the hole is recombined with one of the injected electrons. The numerical simulation shows a gain of about $10^4$. The speed of the SPD device depends on the recombination lifetime $\tau_h$ of the trapped hole, and is in the order of 5 ns (bandwidth of about 100 MHz). Note that the gain-bandwidth product is in the tera-hertz range. In fact, single-electron transistors with gain-bandwidth products above 0.3 THz have been demonstrated experimentally [47]. The simulation results show that the injected electrons do not spread inside the absorption region before reaching the highly doped substrate, as shown in FIG. 6. Therefore, only about 1% of the volume of the absorbing layer is bombarded with the injected electrons, and hence the average recombination rate of the photo-generated holes in this region is kept small. Numerical simulation shows this feature, as the carrier recombination mainly occurs in a very small volume of about 0.03% of the absorbing layer, as shown in FIG. 7. This is a key reason for high transfer efficiency of the photo-generated holes to the nano-switch. Note that this feature is almost independent of the nano-switch mechanism, and is valid for the other two methods.

Nano-resonator: Although the nano-transistor has a rather simple structure, it requires critical lateral dimensions that are not easy to achieve. One method that can alleviate this requirement is utilization of resonant tunneling in the vertical direction. The resonator provides an effective "energy filter" that narrows the energy spectrum of the carriers. Similar to the performance of a resonant-tunneling-diode (RTD) [49, 50], this produces very sharp change of injected current versus the potential deformation of the nano-resonator and enhance the device sensitivity. Resonant tunneling is an extremely fast process [51] and does not limit the gain-bandwidth of the SPD device according to one embodiment of the present invention. Moreover, resonant tunneling diodes are not very temperature sensitive and good performance in a wide range of material systems have been reported at room temperature [52-54].

Figure 11:
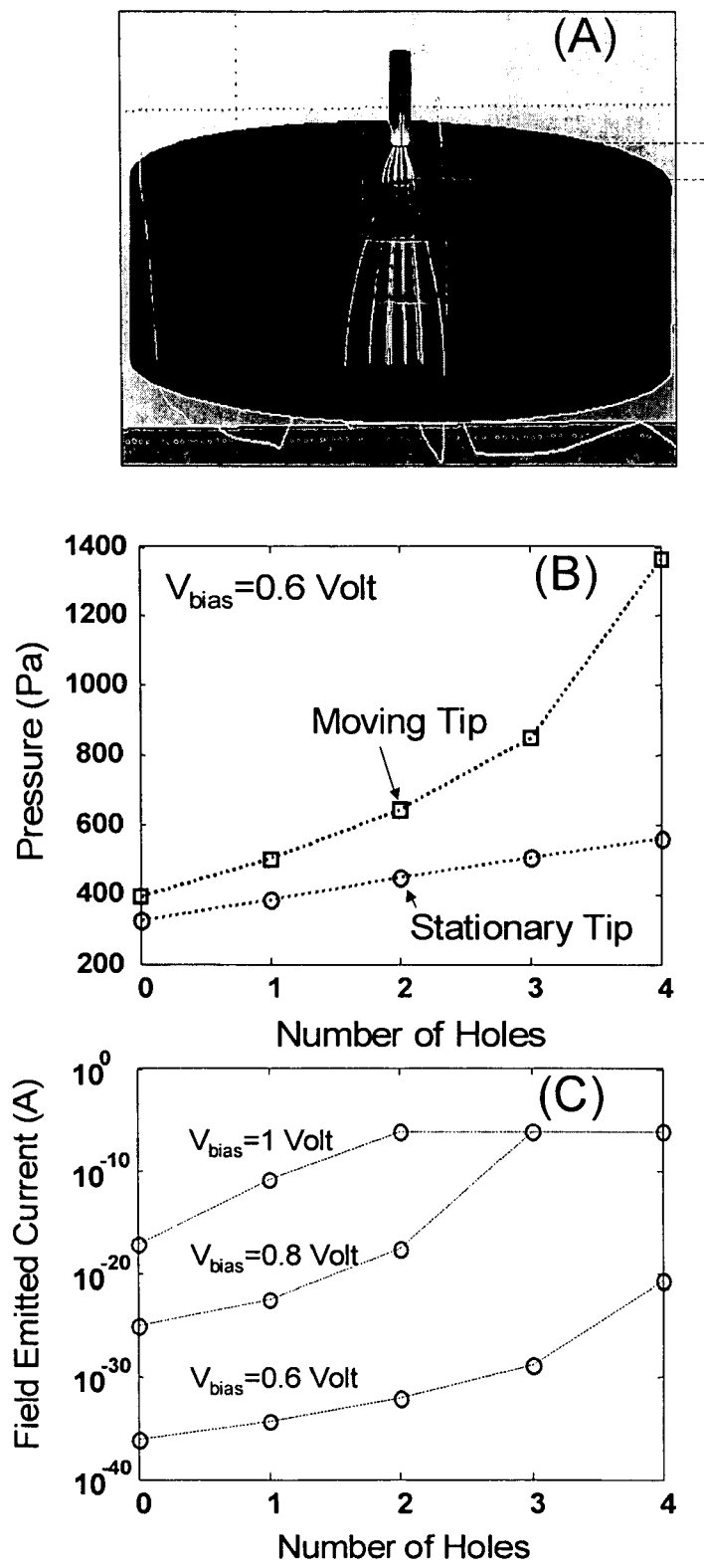
FIG. 11 shows schematically (A) a simulated nano-electromechanical switch and the trajectory of the field-emitted electrons, (B) the charge induced pressure at the surface of the tip versus the number of the confined holes for a moving and a stationary tip, and (C) the current versus the number of the confined holes at different nano-tip bias value, according to one embodiment of the present invention.

Nano-Electromechanical Switch: An alternative method to enhance the sensitivity of the nano-switch is to employ mechanical movements in the form of nano-electro-mechanical system (NEMS) [55-57]. In particular, recent research on freestanding nanometer size beams show the sensitivity of such systems in transferring single electrons as "electron nano-shuttles" [58-60]. The small dimension of the nano-electromechanical component leads to a very high speed in these devices, and frequency responses approaching gigahertz range have been experimentally measured at room temperature [61]. The SPD device according to one embodiment of the present invention contains a metallic or highly doped semiconductor nano-tip suspended only a few tens of nanometers above the absorbing region, as shown in FIG. 4. Application of a small negative external bias to the tip produces electron depletion in the slightly n-doped absorbing layer. The resulted metal/vacuum/semiconductor structure is very similar to a metal/insulator/semiconductor (MIS) device that is commonly used as charge-couple device (CCD) for visible and infrared imaging. The photo-generated holes are attracted towards the surface of the device, and accumulate under the nano-tip. The small geometry of the nano-tip combined with the short distance between the tip and the surface of the semiconductor causes an extremely high sensitivity that is manifested by a large Coulomb pressure produced by a single hole (or electron). More importantly, the fact that the tip can move produces an "amplification" process: the closer the tip gets to the semiconductor surface, the higher is the pressure, which pulls the tip even further. The semi-classical calculation based on finite element method shows that the pressure increases in a superlinear fashion for a moving tip compared to a linear increase for a stationary tip, as shown in FIG. 11. This leads to a rapid reduction of the airgap between the tip and the semiconductor. FIG. 11(A) shows a simulated nano-electromechanical switch and the trajectory of the field-emitted electrons. The field emission of the electrons from the tip to the semiconductor then increases dramatically, as it is an exponential function of the inverse of the airgap. Such emission is a well-known process, and is the basis of scanning tunneling microscopy (STM) [62]. Recent experimental results have shown very high current injection due to field emission from suspended single electron nano-beams [63]. FIG. 11(B) shows the charge induced pressure at the surface of the tip versus the number of the confined holes for a moving and a stationary tip. FIG. 11(C) shows current of the SPD device according to the present invention versus the number of holes under the nano-tip for different bias values. Note that in response to the presence of a single hole, the current changes by more than seven orders of magnitude for $V_{bias}=1$ volt. Note that the airgap is controllable with the external bias. Therefore, the sensitivity of the SPD device is changed by changing the bias value to cover an extremely wide sensing dynamic range.

Fabrication of the Single Photon Detector

Figure 13:
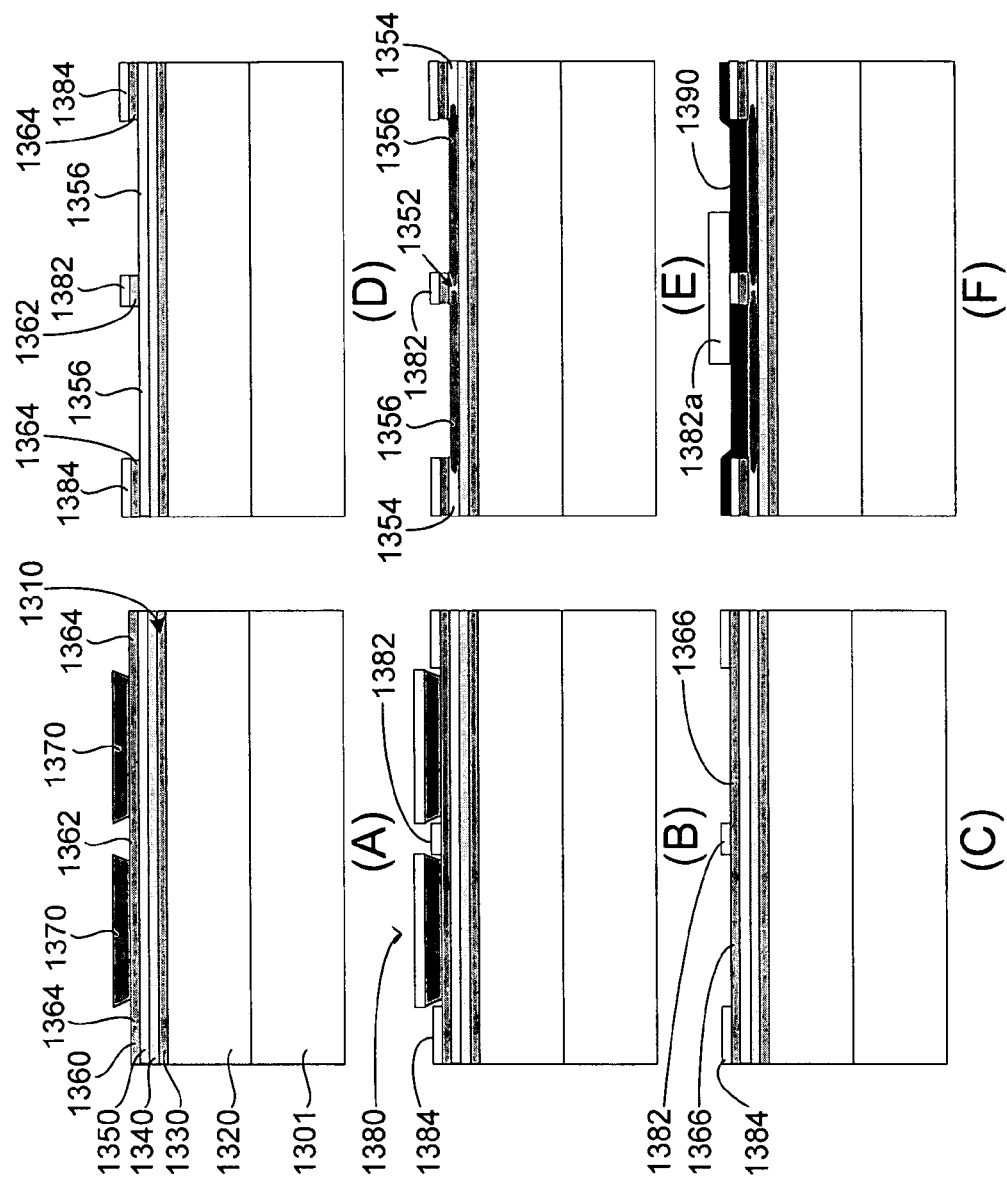
FIG. 13 shows schematically processing steps for fabricating a single photon detector according to one embodiment of the present invention.

Referring to FIG. 13, processing step for the fabrication of the SPD device according to one embodiment of the present invention is shown. The process step includes (a) providing a substrate 1301; (b) growing a multilayered structure 1310 on the substrate 1301 having an absorption layer 1320 formed on the substrate 1310, a first layer 1330 formed on the absorption layer 1320, a second layer 1340 formed on the first layer 1330, and a third layer 1350 formed on the second layer 1340 and a fourth layer 1360 formed on the third layer 1350; (c) defining an negative photoresist pattern 1370 on the fourth layer 1360 of the multilayered structure 1310 such that the fourth layer 1360 is divided into a first region 1362 and a second region 1364 separated by the negative photoresist pattern 1370 thereon; (d) metallizing a metal layer 1380 on the defined negative photoresist pattern 1370 and the first and second regions of the fourth layer 1360; (e) lifting off the negative photoresist pattern 1370 on the fourth layer 1360 so as to form a first electrode 1392 in the first region 1362 and a second electrode 1394 in the second region 1364 of the fourth layer 1360, respectively; (f) etching off a region 1366 of the fourth layer 1360 under the negative photoresist pattern 1370 to uncover a corresponding region 1356 of the third layer 1350; (g) oxidizing the uncover region 1356 of the third layer 1350 of the multilayered structure 1310 so as to form an oxidized region 1356 therein and a carrier barrier region 1352 thereunder the first electrode 1382 which defines an effective dimension of a nano-injector; and (h) planarizing and passivating the oxidized region 1356 of the third layer 1350 and the first and second electrodes 1382 ans 1384 to form a single photon detector. The processing step further includes forming a top electrode 1382a on the first electrode 1382 of the nano-injector.

In one embodiment, the growing step is performed with an MBE process and/or MOCVD process. The defining step is performed with an E-beam and a photolithographical process. The metallizing step is performed with a metal evaporation process. The etching step is performed with an ICP-RIE etching process.

Figure 14:
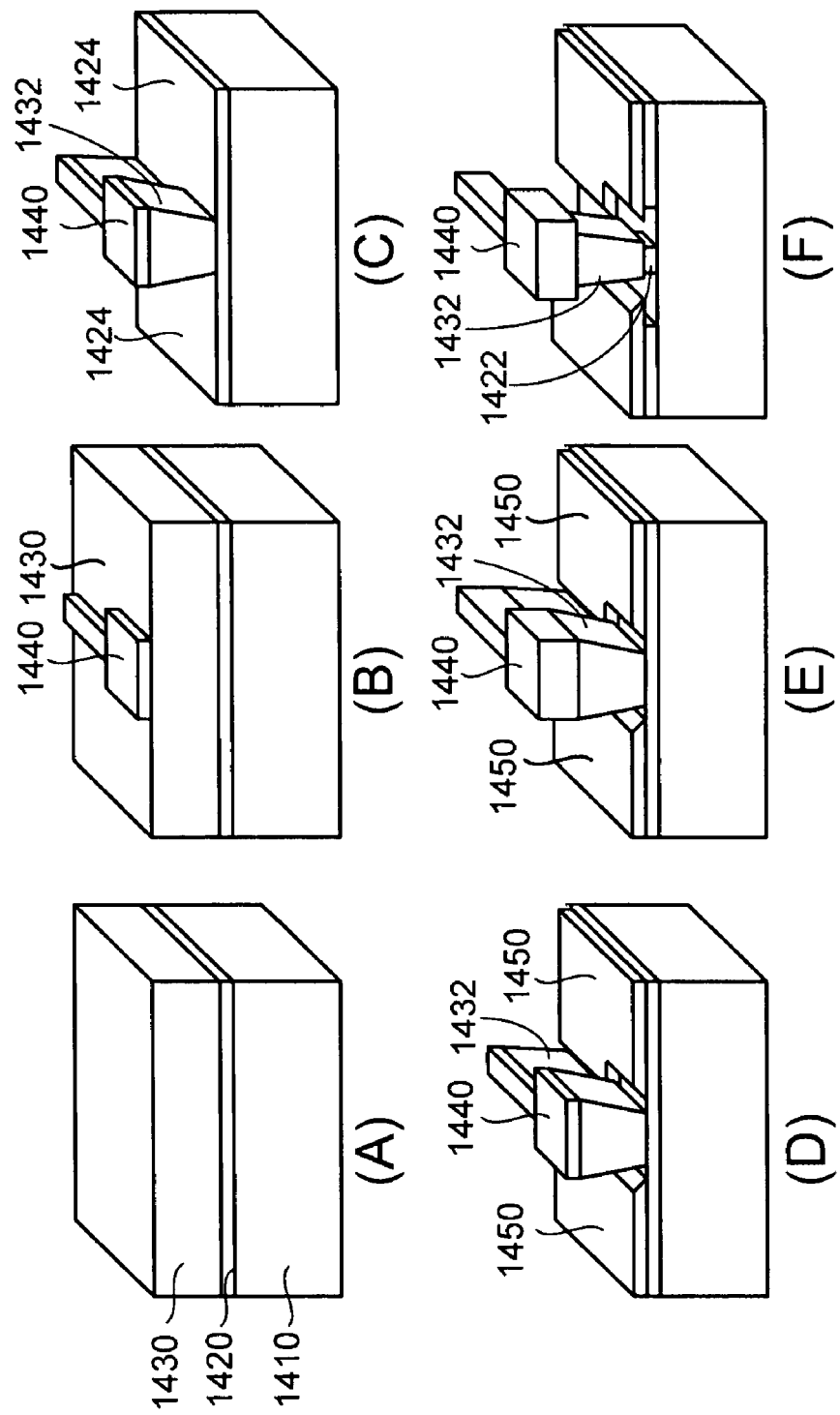
FIG. 14 shows schematically processing steps for fabricating a single photon detector according to another embodiment of the present invention.

Referring to FIG. 14, a method for fabrication of the SPD device is shown according to another embodiment of the present invention. The fabrication method includes the steps of growing an epi-layer having a first layer 1410, a second layer 1420 formed on the first layer 1410, and a third layer 1430 formed on the second layer 1420; and performing a self-alignment and lateral oxidization process on the epi-layer to fabricate the SPD device.

The step performing a self-alignment and lateral oxidization process comprises the following steps: at first, an electrode 1440 formed on the third layer 1430 of the epi-layer by metallization and liftoff processes. The third layer 1430 of the epi-layer is etched down so as to leave a potion 1432 of the third layer 1430 under the electrode 1440 and uncover a region 1424 of the second layer 1420 by a dry etching process. The dry etching process is a process known to the people skilled in the art, which removes material, typically a masked pattern of semiconductor material, by exposing the material to a bombardment of ions that dislodge portions of the material from the exposed surface. Then, the electrode 1440 and the uncovered region 1424 of the second layer 1420 are metallized by a metal evaporation process. Next, a metal plating process is performed on the metallized electrode 1440. Finally, a lateral oxidation and etching process is formed on the processed epi-layer to create a nano-injector.

Figure 15:
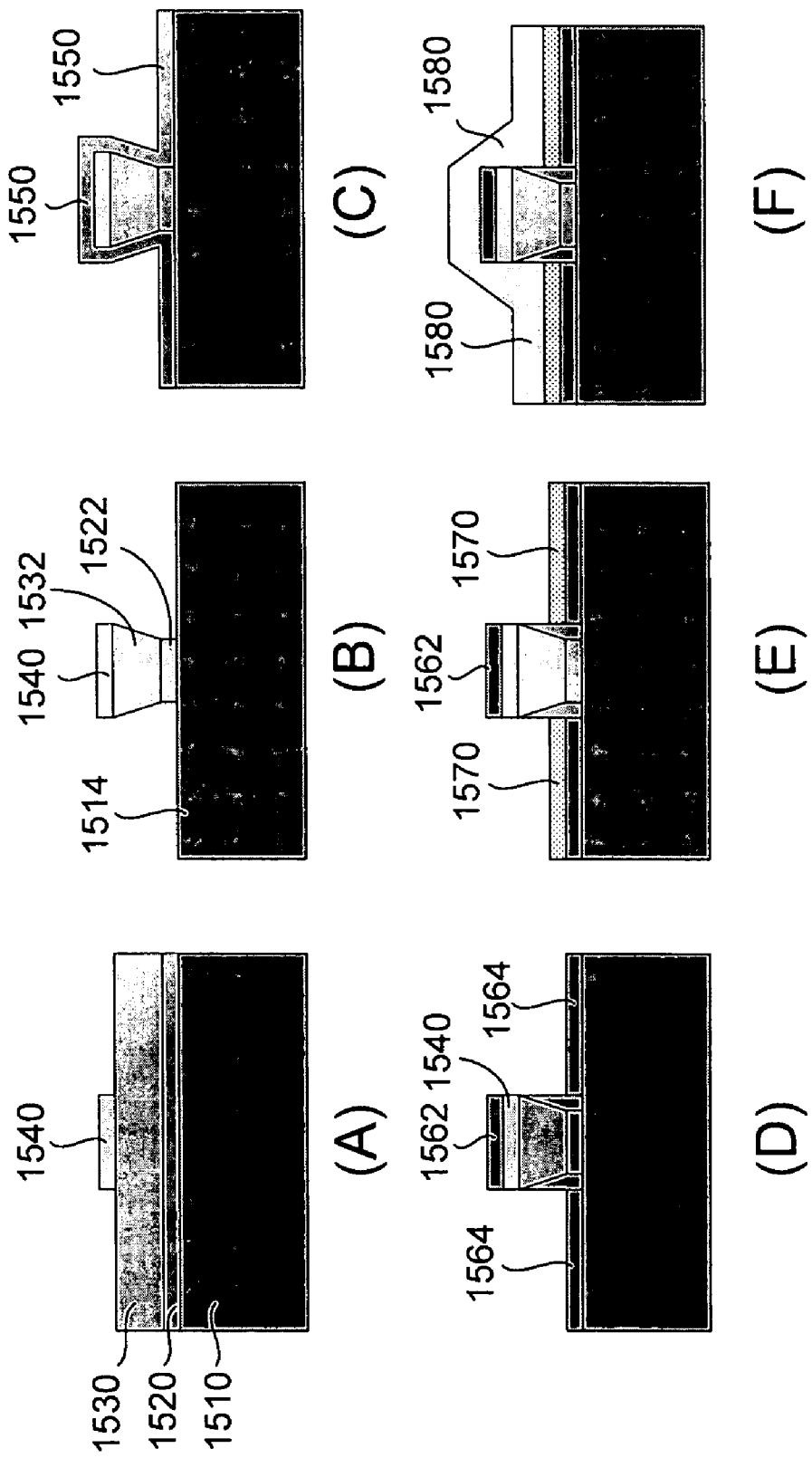
FIG. 15 shows schematically processing steps for fabricating a single photon detector according to an alternative embodiment of the present invention.

FIG. 15 shows an alternative processing step of fabricating the SPD device according to the present invention. Specifically, the processing step includes growing an epi-layer having a first layer 1510, a second layer 1520 formed on the first layer 1510, and a third layer 1530 formed on the second layer 1520; and performing a self-alignment and self-isolation process on the epi-layer to fabricate the SPD device.

In one embodiment, the step of performing the self-alignment and self-isolation process comprises the steps of (i) forming an electrode 1540 on the third layer 1530 of the epi-layer by metallization and liftoff processes; (ii) etching off the third layer 1530 and the second layer 1520 of the epi-layer so as to leave a potion 1532 of the third layer 1530 and a portion 1522 of the second layer 1520 under the electrode 1540 and uncover a region 1514 of the first layer 1510 by a dry etching process; (iii) forming a silicon nitride ($Si_3N_4$) layer 1550 on the uncovered region 1514 of the first layer 1510 and the electrode 1540 by a plasma enhanced chemical vapor deposition (PECVD) process; (iv) dry etching the $Si_3N_4$ layer 1550 formed on the uncovered region 1514 of the first layer 1510 and the electrode 1540 to form an etched surfaces of the first layer 1510 and the electrode 1540, respectively; (v) metallizing the etched surfaces of the first layer 1510 and the electrode 1540 to form a metal layer 1562 on the electrode 1540 and a metal layer 1564 on the etched surface of the first layer 1510 by a metal evaporation process; (vi) anodizing the metal layer 1564 to form an nodization layer 1570 thereon; and (vii) metallizing the nodization layer 1570 and the metal layer 1562 to form a metal layer 1580 thereon by a metal evaporation process, thereby creating a nano-injector.

Without limit the scope of the present invention, different individual processes utilized in the fabrication of the SPD device according to the present invention are described briefly as follows. These processes include, but not limited to, self-alignment, self-isolation, lateral oxidation and etching, and overgrowth passivation.

Lateral Oxidation & Lateral Etching: Wet oxidation of InAlAs has been used for lateral current limitation/confinement in several advanced optoelectronic devices such as long wavelength VCSELs [79] buried ridge lasers [80], and detectors [81]. This process provides submicron lateral confinement control, since the oxidation rate is rather slow. However, the diffusion-limit properties of the oxidation mean that the surrounding features have a large impact on the oxidation rate. Therefore, formation of an opening with precise dimensions improves the control of the lateral oxidation [82] and its uniformity over large areas, since the dimension of the opening dictates the process rate primarily. Similarly, lateral selective wet etching is used to achieve lateral size control below the lithographic limit. Although some wet processes are reaction-limited, there are several diffusion limited selective etches that are needed for undercutting the proposed nano-switches [83].

Self-alignment: Self-alignment is a process that has been used to achieve alignment tolerances well below the available photo- and e-beam lithography limits, and device fabrication such as metal-insulator-semiconductor field effect transistors (MISFET) [70], amorphous silicon thin-film transistors [71], and more recently single electron transistors [72]. FIG. 14 shows a combination of self-alignment and lateral etching and/or oxidation that produces the SPD device with a nano-switch. In this process, the top metal contact is used as a self-aligned dry etch mask. Also, it is used as a self aligned shadow mask during metal evaporation. Note that the presence of the metal on the surface leaves a precise gap around the nano-switch and will greatly improve the tolerance of lateral etch and/or oxidation.

Self-isolation: Isolation of different metal and semiconductor layers at the critical dimensions required here is a significant problem. Although formation of an air-bridge shown in the last step of provides good electrical isolation, it is not very stable mechanically. Self-isolation of metals has been demonstrated more than a decade ago [73]. In particular, anodization of aluminum produces aluminum oxide layers with excellent mechanical and electrical properties. Structural studies of the anodized aluminum oxide show that the oxide has a very conformal nature even in the nanometer levels [74]. This means that the oxide grows uniformly around the edge of the metal. The metal-oxide interface is atomically smooth (similar to $Si/SiO_2$) which ensures a high mechanical stability. More importantly, the anodization process is self-limiting, and self-healing: any crack in the oxide provides a conductive path, which leads to a further localized oxidation or "healing." The thickness of the oxide is a function of anodization voltage, and is controlled precisely. These leads to an extremely good electrical isolation that is not easily achievable otherwise. For instance, recent studies [75] show that the leakage current for a 5 volts bias over a 500 nm thick anodized oxide (100 kV/cm) is about $2\times10^{-8}$ A/cm$^2$, which is equal to a resistivity of $5\times10^{12}$ ohm·cm (more than 50 times higher than $Si_3N_4$). This leakage is equal to only ~200 electrons/V·s·$\mu m^2$. Also, no breakdown has been detected up to very high fields around 7.5 MV/cm [76]. It should be noted that the concept of self-isolation is not limited to aluminum anodization, and can be extended to other metals using electrophoretic deposition (EPD) of oxides [77]. FIG. 15 shows a fabricating process of the self-isolation for formation of a mechanically robust and isolated top electrode according to the present invention. Note that traditional methods require polymer-base planarization (BCB or polyamide) and subsequent etch-back to open access to the top contact. In planarization of submicron features, achieving a uniform process across large areas (such as imaging arrays) is extremely difficult. Also, all polymers produce a large amount of stress during curing process, since they have less than 100% solid contents inevitably. This leads to a high rate of mechanical damage to submicron features. Other issues such as microtrenching and polymer micro-defects during conventional planarization only add to these problems [78].

Overgrowth Passivation: Passivation of the nano-transistor and nano-resonator is a difficult and crucial task. Although sulfur passivation is a proven method for reducing the surface leakage current in type-II detectors [84, 85], the leakage is still significant for the submicron devices. Also, the current injection densities in the SPD devices are many orders of magnitude higher than the current density in reverse biased detectors, and hence the long-term stability of the sulfur passivation could be an issue here. Terminating the crystalline surface of the device with a wider bandgap crystal is a much more robust and effective method. In fact, excellent passivation results has been shown in GaAs [86], and recently in type-II detectors [87], using epitaxial overgrowth.

The present invention, among other things, discloses a photodetector for single photon detection based on carrier focalization and carrier augmentation. The carrier focalization is responsible for enhancing the photo-generated carrier concentration to a level that affects the electrostatic potential of the photodetector, and consequently, its energy band structure. Deformation of the energy band structure would then lead to enhancement of the injection level in a nano-injector, and hence carrier augmentation. The photodetector for single-photon detection, without the use of avalanche multiplication, operates at low bias voltages and without excess noise.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

LIST OF REFERENCES

[1]. Data from: A. Migdall and G. J. Dowling, "Introduction to Journal of Modern Optics Special Issue on Single-photon: detectors, applications, and measurement methods," J. of Modern Optics, Vol. 51, p. 1265, 2004.

[2]. V. Ntziachristos, X. Ma, and Britton Chance, "Time-correlated single photon counting imager for simultaneous magnetic resonance and near-infrared mammography," Rev. of Scientific Instruments Vol. 69, p. 4221, 1998.

[3]. B. Brooksby, S. Jiang, Ha. Dehghani, B. W. Pogue, K. D. Paulsen, C. Kogel, M. Doyley, J. B. Weaver, and S. P.

Poplack, "Magnetic resonance-guided near-infrared tomography of the breast," Rev. of Scientific Instruments Vol. 75, p. 5262, 2004.
[4]. Y. Shao, R. W. Silverman, R. Farrell, L. Cirignano, R. Grazioso, K. S. Shah, G. Visser, M. Clajus, T. O. Tummer, and S. R. Chemy, "Design studies of a high resolution PET detector using APD arrays," IEEE Trans. Nucl. Sci., Vol. 47, p. 1051 2000.
[5]. V. Ntziachristos, C. Bremer, R. Weissleder, "Fluorescence imaging with near-infrared light: new technological advances that enable in vivo molecular imaging," European Radiology, Vol. 13, p. 195, 2003.
[6]. M. Hintersteiner, A. Enz, P. Frey, A. Jaton, W. Kinzy, R. Kneuer, U. Neumann, M. Rudin, M. Staufenbiel, M. Stoeckli, K. Wiederhold, and H. Gremlich, "In vivo detection of amyloid-b deposits by near-infrared imaging using an oxazine-derivative probe" Nature Biotechnology Vol. 23, p. 577, 2005.
[7]. N. Y. Morgan, S. English, W. Chen, V. Chemomordik, A. Russo, P. D. Smith, and A. Gandjbakhche, "Real Time In Vivo Non-invasive Optical Imaging Using Near-infrared Fluorescent Quantum Dots," Academic Radiology Vol. 12, p. 313, 2005.
[8]. A. F. Abouraddy, B. E. A. Saleh, A. V. Sergienko, and M. C. Teich, "Role of Entanglement in Two-Photon Imaging," Phys. Rev. Lett., Vol. 87, p. 123602, 2001.
[9]. D. V. Strekalov and J. P. Dowling, "Two-photon interferometry for high-resolution imaging," J. of Modern Optics, vol. 49, p. 519, 2002.
[10]. A. R. Altman, K. G. Koprulu, E. Corndorf, P. Kumar, and G. A. Barbosa, "Quantum Imaging of Nonlocal Spatial Correlations Induced by Orbital Angular Momentum," Phys. Rev. Lett., Vol. 94, p. 123601, 2005.
[11]. M. R. Clark, D. M. McCann, M. C. Forde, "Application of infrared thermography to the non-destructive testing of concrete and masonry bridges," NDT & E International, Vol. 36, p. 265, 2003.
[12]. M. Krishnapillai, R. Jones, I. H. Marshall, "Thermography as a tool for damage assessment," Composite Structures, Vol. 67, p. 149, 2005.
[13]. A. Goldberg, P. N. Uppal, M. Winn, "Detection of buried land mines using a dual-band LWIR/LWIR QWIP focal plane array," Infrared Phys. & Technol., Vol. 44, p. 427, 2003.
[14]. B. H. P Maathuis and J. L Van Genderen, "A review of satellite and airborne sensors for remote sensing based detection of minefields and landmines," International J. of Remote Sensing, Vol. 25, p. 5201, 2004.
[15]. I. Y. H. Gu and T. Tjahjadi, "Detecting and locating landmine fields from vehicle- and air-borne measured IR images," Pattern Recognition, Vol. 35, p. 3001, 2002.
[16]. W. J. Kindt, N. H. Shahrjerdy, and H. W. van Zeijl, "A silicon avalanche photodiode for single optical photon counting in the Geiger mode," Sensors and Actuators A-Physical, Vol. 60, p. 98, 1997.
[17]. S. Cova, M. Ghioni, A. Lacaita, and F Zappa, "photodiodes and quenching circuits for single-photon detection," Appl. Optics, Vol. 35, p. 1956, 1996.
[18]. G. Karve, X. Zheng, X. Zhang, X. Li, N. Li, S. Wang, F. Ma, A. Holmes, J. C. Campbell, G. S. Kinsey, J. C. Boisvert, T. D. Isshiki, R. Sudharsanan, D. S. Bethune, and W. P. Risk, "Geiger Mode Operation of an $In_{0.53}Ga_{0.47}As$—$In_{0.52}Al_{0.48}As$ Avalanche Photodiode," IEEE J. of Quantum Elect., Vol. 39, p. 1281, 2003.
[19]. G. Karve, S. Wang, F. Ma, X. Li, J. C. Campbell, R. G. Ispasoiu, D. S. Bethune, W. P. Risk, G. S. Kinsey, J. C. Boisvert, T. D. Isshiki, and R. Sudharsanan, "Origin of dark counts in $In_{0.53}Ga_{0.47}As/In_{0.52}Al_{0.48}As$ avalanche photodiodes operated in Geiger mode," Appl. Phys. Lett., Vol. 86, p. 063505, 2005.
[20]. S. L. Chuang, Physics of Optoelectronic Devices, New York: John Wiley & Sons, pp. 37-39, 1995.
[21]. X. G. Zheng, J. S. Hsu, X. Sun, J. B. Hurst, X. Li, S. Wang, A. L. Holmes, J. C. Campbell, A. S. Huntington, and L. A. Coldren, "A 12×12 $In_{0.53}Ga_{0.47}As$—$In_{0.52}Al_{0.48}As$ Avalanche Photodiode Array," IEEE J. OF Quantum Elect. Vol. 38, p. 1536, 2002.
[22]. G. Ulu, A. V. Sergienko, and M. S. Unlu, "Influence of hot-carrier luminescence from avalanche photodiodes on time-correlated photon detection," Optics Lett., Vol. 25, p. 758, 2000.
[23]. C. Kurtsiefer; P. Zarda; S. Mayer; and H. Weinfurter "The breakdown flash of silicon avalanche photodiodes— back door for eavesdropper attacks?" J. of Modern Optics, Vol. 48, p. 2039, 2001.
[24]. S. Somani, S. Kasapi, K. Wilsher, and W. Lo, R. Sobolewski, and G. Goltsman, "New photon detector for device analysis: Superconducting single-photon detector based on a hot electron effect," J. Vac. Sci. Technol. B, Vol. 19, p. 2766, 2001.
[25]. D. Rosenberg, A. E. Lita, A. J. Miller, S. Nam, and R. E. Schwall, "Performance of Photon-Number Resolving Transition-Edge Sensors With Integrated 1550 nm Resonant Cavities," IEEE Trans. on Appl. Supercond., Vol. 15, p. 575, 2005.
[26]. H. Hashiba, V. Antonov, L. Kulik, S. Komiyama, and C. Stanley, "Highly sensitive detector for submillimeter wavelength range," Appl. Phys. Lett., Vol 85, p. 6036, 2004.
[27]. A. J. Shield, M. P. O'Sullivan, I. Farrer, D. A. Ritchie, M. L. Leadbeater, N. K. Patel, R. A. Hoqq, C. E. Norman, N. J. Curson, M. Pepper, "Single photon detection with a quantum dot transistor," Japanese J. of Appl. Phys. Part-1, Vol. 40, p. 2058, 2001.
[28]. For example, Indigo's low-noise ISC 9809, Data Sheet, Indigo Systems, Inc.
[29]. T. Kitade, K. Ohkura, and A. Nakajima, "Room-temperature operation of an exclusive-OR circuit using a highly doped Si single-electron transistor," Appl. Phys. Lett., Vol. 86, p. 123118, 2005.
[30]. M. Saitoh, H. Harata, and T. Hiramoto, "Room-temperature demonstration of low-voltage and tunable static memory based on negative differential conductance in silicon single-electron transistors," Appl. Phys. Lett., Vol. 85, p. 6233, 2004.
[31]. P. W. Li, W. M. Liao, D. M. T. Kuo, S. W. Lin, P. S. Chen, S. C. Lu, and M. J. Tsai, "Fabrication of a germanium quantum-dot single-electron transistor with large Coulomb-blockade oscillations at room temperature," Appl. Phys. Lett., Vol. 85, p. 1532, 2004.
[32]. T. Kamimura, M. Maeda, K. Sakamoto, K. Matsumoto, "Room-temperature single-hole transistors made using semiconductor carbon nanotube with artificial defects near carrier depletion region," Japanese J. of Appl. Phys. Part 1, Vol. 44, p. 461, 2005.
[33]. S. Hu, Y. Wu, C. Sung, C. Chang, and T. Huang, "A Dual-Gate-Controlled Single-Electron Transistor Using Self-Aligned Polysilicon Sidewall Spacer Gates on Silicon-on-Insulator Nanowire," IEEE Trans of Nanotechnology, Vol. 3, p. 93, 2004.
[34]. Z. Chen, O. Baklenov, E. T. Kim, I. Mukhametzhanov, J. Tie, A. Madhukar, Z. Ye, and J. C. Campbell, "Normal incidence InAs/Al$_x$Ga$_{1-x}$As quantum dot infrared photodetectors with undoped active region," J. of Appl. Phys., Vol. 89, p. 4558, 2001.

[35]. S. Raghavan, D. Forman, P. Hill, N. R. Weisse-Bernstein, G. von Winckel, P. Rotella, S. Krishna, S. W. Kennerly and J. W. Little, "Normal-incidence InAsÕIn0.15Ga0.85As quantum dots-in-a-well detector operating in the long-wave infrared atmospheric window (8-12 mm)", J. of Appl. Phys. Vol. 96, p. 1036, 2004.

[36]. E. Towe and D. Pan, "Semiconductor quantum-dot nanostructures: Their application in a new class of infrared photodetectors," IEEE J. of Selec. Topics in Quant. Elect., Vol. 6, p. 408, 2000.

[37]. H. Mohseni, Y. Wei, and M. Razeghi, "High performance type-II InAs/GaSb superlattice photodiodes," SPIE, vol. 4288, pp. 191-199, 2001.

[38]. J. L. Johnson, L. A. Samoska, A. C. Gossard, J. Merz, M. D. Jack, G. R. Chapman, B. A. Baumgratz, K. Kosai, S. M. Johnson, "Electrical and optical properties of infrared photodiodes using the InAs/Ga$_{1-x}$In$_x$Sb superlattice in heterojunctions with GaSb," J. Appl. Phys., Vol. 80, p. 1116, 1996.

[39]. H. Mohseni, E. Michel, M. Razeghi, W. Mitchel, and G. Brown, "Growth and characterization of InAs/GaSb type II superlattices for long-wavelength infrared detectors," SPIE Proc., vol. 3287, Photodetectors: Materials and Devices III, pp. 30-37, 1998.

[40]. Y. Wei, A. Hood, H. Yau, A. Gin, M. Razeghi, M. Z. Tidrow, and V. Nathan, "Uncooled operation of type-II InAs/GaSb superlattice photodiodes in the midwavelength infrared range," Appl. Phys. Lett., Vol. 86, p. 233106, 2005.

[41]. See for example bulk InSb recombination parameters at: Handbook Series on Semiconductor Parameters, ed. M Levinshtein, S Rumyantsev and M Shur, World Scientific, Singapore, 1996.

[42]. Y. Wei, A. Gin, M. Razeghi, and G. J. Brown, "Advanced InAs—GaSb superlattice photovoltaic detectors for very long wavelength infrared applications," Appl. Phys. Lett., Vol. 80, p. 3262, 2002.

[43]. APSYS from CrossLight Inc., (Burnaby, BC, V5C6P7 Canada).

[44]. H. Mohseni, E. Michel, J. Sandven, M. Razeghi, W. Mitchel, and G. Brown, "Growth and characterization of InAs/GaSb photoconductors for long wavelength infrared range," Applied Physics Letters, vol. 71, pp. 1403-1405, 1997.

[45]. M. Macucci, K. Hess, and G. J. Iafrate, "Simulation of electronic properties and capacitance of quantum dots," J. Appl. Phys., Vol. 77, p. 3267, 1995.

[46]. J. R. Tucker, "Complementary digital logic based on the "Coulomb blockade"," J. Appl. Phys., Vol. 72, p. 4399, 1992.

[47]. H. Brenning, S. Kubatkin, and P. Delsing, "Fabrication of aluminum single-electron transistors with low resistance-capacitance product," J. of Appl. Phys., Vol. 96, p. 6822, 2004.

[48]. Based on APSYS simulation tool from Crosslight Inc.

[49]. M. Tsuchiya, H. Sakaki, J. Yoshino, "Room temperature observation of differential negative-resistance in AlAs/GaAs/AlAs Resonant tunneling Diode," Japanese J. of Appl. Phys. Part 2, Vol. 24, p. L466, 1985.

[50]. E. R. Brown, T. C. Sollner, W. D. Goodhue, and C. D. Parker, "Fundamental Oscillation up to 200 GHz in Resonant-tunneling Diodes," IEEE Trans. Elec. Dev., Vol. 34, p. 2381, 1987.

[51]. E. R. Brown, and C. D. Parker, "Resonant tunnel diode as submillimeter-wave source," Phil. Trans. of the Royal Society of London, Vol. 354, p. 2365, 1996.

[52]. Y. Xu, P. Fay, D. H. Chow, and J. N. Schulman, "Experimental Investigation of the Temperature Dependence of InAs/AlSb/GaSb Resonant Interband Tunnel Diodes," IEEE Trans. on Elec. Dev., Vol. 51, p. 1060, 2004.

[53]. Y. K. Su, C. H. Wu, J. R. Chang, k. M. Wu, H. C. Wang, W. B. Chen, S. J. You, and S. J. Chang, "Well width dependence for novel AlInAsSb/InGaAs double-barrier resonant tunneling diode," Soli-State Elect., Vol 46, p. 1109, 2002.

[54]. Y. Suda and H. Koyama, "Electron resonant tunneling with a high peak-to-valley ratio at room temperature in Si$_{1-x}$Ge$_x$/Si triple barrier diodes," Appl. Phys. Lett., Vol. 79, p. 2273, 2001.

[55]. M. Despont, J. Brugger, U. Drechsler, U. Dürig, W. Häberle, M. Lutwyche, H. Rothuizen, R. Stutz, R. Widmer, G. Binnig, H. Rohrer and P. Vettiger, "VLSI-NEMS chip for parallel AFM data storage," Sensors and Actuautors, Vol. 80, P. 100, 2000.

[56]. F. W. Beil, A. Wixforth, R. H. Blick, "Investigation of nano-electromechanical-systems using surface acoustic waves," Phusica E., Vol. 13, p. 473, 2002.

[57]. H. Yamaguchi, R. Dreyfus, S. Miyashita, and Y Hirayama, "Application of InAs freestanding membranes to electromechanical systems," Japanese J. of Applied Phys. Part-1, Vol. 41, p. 2519, 2002.

[58]. D. V. Scheible, A. Erbe, R. H. Blick, "Tunable coupled nanomechanical resonators for single-electron transport," New J. of Phys., Vol. 4, Art. No. 86, 2002.

[59]. R. I. Shekhter, Y. Galperin, L. Y. Gorelik, A. Isacsson, and M. Johnson, "Shuttling of electrons and Cooper pairs," J. of Physcs-Condense Matter, Vol. 12, P. R441, 2003.

[60]. D. V. Scheible and R. H. Blick, "Silicon nanopillars for mechanical single-electron transport," Appl. Phys. Lett., Vol. 84, p. 4632, 2004.

[61]. D. V. Scheible, C. Weiss, and R. H. Blick, "Effects of low attenuation in a nanomechanical electron shuttle," J. of Appl. Phys., Vol. 96, p. 1757, 2004.

[62]. G. Benning, H. Rohrer, C. Gerber, and E. Weibel, "Surface Studies by Scanning Tunneling Microscopy," Phys. Rev. Lett., Vol. 49, p. 57, 1982.

[63]. D. V. Scheible, C. Weiss, J. P. Kotthaus, and R. H. Blick, "Periodic Field Emission from an Isolated Nanoscale Electron Island," Phys. Rev. Lett., Vol 93, p. 186801, 2004.

[64]. G. R. Nash, N. T. Gordon, D. J. Hall, M. K. Ashby, J. C. Little, G. Masterton, J. E. Hails, J. Gless, L. Haworth, M. T. Emeny, T. Ashley, "Infrared negative luminescent devices and higher operating temperature detectors," Physica E, Vol. 20, p. 540, 2004.

[65]. T. Ashley, A. B. Dean, C. T. Elliott, C. F. McConville, G. J. Pruce, and C. R. Whitehouse, "Ambient-temperature diodes and field-effect transistors in InSb/In$_{1-x}$Al$_x$Sb," Appl. Phys. Lett., Vol. 59, p. 1761, 1991.

[66]. U. Weidenmuller, P. Hahmann, L. Pain, M. Jurdit, D. Henry, Y. Laplanche, S. Manakli, and J. Todeschini, "Critical dimension adapted alignment for EBDW," Microelec. Eng., Vol. 78, p. 16, 2005.

[67]. R. L. Vanmeirhaeghe, W. H. Laflere, and F. Cardon, "Influence of defect passivation by hydrogen on the Schottky-barrier height of GaAs and InP contacts," J. of Appl. Phys., Vol. 76, p. 403, 1994.

[68]. O. Katz, G. Bahir, and J. Salzman, "Persistent photocurrent and surface trapping in GaN Schottky ultraviolet detectors," Appl. Phys. Lett., Vol. 84, p. 4092, 2004.

[69]. M. A. Kinch, C. F. Wan, and J. D Beck, "1/f Noise in HgCdTe photodiodes," J. of Elect. Mat., Vol. 34, p. 928, 2005.

[70]. F. C. Jain, S. K. Islam, M. Gkhale, "Self-aligned Metal-Sio2-Silicon based MISFETs having modulation doped channels," Int. J. of Infrared and Millineter Waves, Vol. 13, p. 1459, 1992.

[71]. O. Sugiura, C. D. Kim, and M. Matsumuru, "New self-alignment process for Amorphous silicon thin-film transistors with polysilicon source and drain," Elect. Lett., Vol. 29, p. 750, 1993.

[72]. Y. Ito, T. Hatano, A. Nakajima, and S. Yokoyama, "Fabrication of Si single-electron transistors having double $SiO_2$ barriers," Appl. Phys. Lett., Vol. 80, p. 4617, 2002.

[73]. D. G. Kimpton and J. G. Swanson, "The formation of plasma anodized aluminafilms on $In_{0.53}Ga_{0.47}As$ device structures," J. of the Electrochem. Soc., Vol. 138, p. 2129, 1991.

[74]. R. Timsit, W. Waddington, C. Humphreys, and J. Hutchison, "Structure of the $Al/Al_2O_3$ interface," Appl. Phys. Lett. Vol. 46, p. 830, (1985).

[75]. A. Giginov, A. Zahariev, and E. Klein, "Electronic Conductivity of (+) aluminum/complex anodic film/electrolyte system," J. of Materials Sci.: Material in Electronics, Vol. 13, p. 543, 2002.

[76]. R. L. Chiu, P. H. Chang, and C. H. Tung, "The effect of anodization temperature on anodic oxide formed on pure Al thin-films," Thin Solid Films, Vol. 260, p. 47, 1995.

[77]. F. Hossein-Babaei and F. Taghibakhsh, "Electrophoretically deposited zinc oxide thick film gas sensor," Elec. Letters Vol. 36, No. 21, (2000).

[78]. H. V. Demir, J. Zheng, V. A. Sabnis, O. Fidaner, J. Hanberg, J. S. Harris, and D. A. B. Miller, "Self-Aligning Planarization and Passivation for Integration Applications in III-V Semiconductor Devices," IEEE Trans. on Semicon. Manufac., Vol. 18, p. 182, 2005.

[79]. H. Gebretsadik, K. Kamath, W. D. Zhou, P. Bhattacharya, C. Caneau, and R. Bhat, "Lateral oxidation of InAlAs in InP-based heterostructures for long wavelength vertical cavity surface emitting laser applications," Appl. Phys. Lett., Vol. 72, p. 135, 1998.

[80]. H. C. Ko, T. Nakamura, T. Koui, N. Suzuki, K. Shiba, and K. Kobayashi, "All selective metalorganic vapor phase epitaxy grown buried-heterostructure laser diodes with selectively oxidized AlInAs current-confinement layer," Appl. Phys. Lett., Vol. 77, p. 1934, 2000.

[81]. I. H. Tan, C. K. Sum, K. S. Giboney, J. E. Bowers, E. L. Hu, B. I. Miller, and R. J. Capik, "120-GHz long-wavelength low-capacitance photodetector with an air-bridged coplanar metal waveguide," IEEE Photon. Tech. Lett., Vol. 7, p. 1477, 1995.

[82]. H. Yu, S. Chang, Y. Su, C. Sung, Y. Lin, H. Yang, C. Huang, and J. Wang, "A simple method for fabrication of high speed vertical cavity surface emitting lasers," Materials Science and Engineering B, Vol. 106, p. 101, 2004.

[83]. For example, selective etching of AlGaSb against InAs. See: A. R. Clawson, "Guide to references on III-V semiconductor chemical etching," Materials Science and Engineering, Vol. 31, p. 438, 2001.

[84]. A. Gin, Y. Wei, A. Hood, A. Bajowala, V. Yazdanpanah, M. Razeghi, and M. Tidrow, "Ammonium sulfide passivation of Type-II InAs/GaSb superlattice photodiodes," Appl. Phys. Lett., Vol. 84, p. 2037, 2004.

[85]. A. Gin, Y. J. Wei, J. J. Bae, A. Hood, J. Nah, and M. Razeghi, "Passivation of type-II InAs/GaSb superlattice photodiodes," Thin Solid Films, Vol. 447, p. 489, 2004.

[86]. Y. Wada and K. Wada, "GaAs surface passivation by deposition of an ultrathin InP-related layer," Appl. Phys. Lett., Vol. 63, p. 379, 1993.

[87]. R. Rehm, M. Walther, F. Fuchs, J. Schmitz, and J. Fleissner, "Passivation of InAs/GaIn.Sb short-period superlattice photodiodes with 10 mm cutoff wavelength by epitaxial overgrowth with $Al_xGa_{1-x}As_ySb_{1-y}$," Appl. Phys. Lett., Vol. 86, p. 173501, 2005.

[88]. H. Mohseni, Type-II InAs/GaSb Superlattices for Infrared Detectors, PhD Thesis, Department of Electrical and Computer Engineering, Northwestern University, 2001.

[89]. H. Mohseni, V. I. Litvinov and M. Razeghi, "Interface-induced Suppression of the Auger Recombination in Type-II InAs/GaSb Superlattices," Physical Review B, Vol. 58, No. 23, p. 15378, 1998.

[90]. H. Mohseni, J. Wojkowski, and M. Razeghi, "Uncooled InAs/GaSb Type-II infrared detectors grown on GaAs substrate for the 8-12 µm atmospheric window," IEEE J. of Quantum Electronics, Vol. 35, No. 7, pp. 1041-1044, 1999.

What is claimed is:

1. A nano-transistor, comprising:
  (a) a photon absorption member; and
  (b) a carrier injecting member having a first layer formed on the photon absorption member and a second layer formed on the first layer and adapted for injecting carriers from the second layer into the photon absorption member, wherein the carrier injecting member has a horizontal dimension in a scale of nanometers,
  wherein the photon absorption member and the first and second layers are configured to have an energy band structure that defines a quantum dot in the first layer, such that when a photon is incident to the photon absorption member, an electron-hole pair is generated therein responsively, and one of the electron and hole of the photo-generated electron-hole pair is transported and trapped into the quantum dot in the first layer so as to enhance the concentration of the corresponding carrier therein, thereby enhancing a rate of injected carriers tunneling through the quantum dot in the first layer into the photon absorption member, wherein the injected carriers are complementary to the corresponding carrier trapped in the quantum dot.

2. The nano-transistor of claim 1, wherein the photon absorption member has a dimension in a scale of micrometers.

3. An array formed with a plurality of nano-transistors of claim 1.

4. A nano-resonator, comprising:
  (a) a photon absorption member; and
  (b) a carrier injecting member having a first layer formed on the photon absorption member, a second layer formed on the first layer, a third layer formed on the second layer, and a fourth layer formed on the third layer, and adapted for injecting carriers from the fourth layer into the photon absorption member, wherein the carrier injecting member has a horizontal dimension in a scale of nanometers,
  wherein the photon absorption member and the first to fourth layers are configured to have an energy band structure that defines a quantum dot in the second layer, such that when a photon is incident to the photon absorption member, an electron-hole pair is generated therein responsively, and one of the electron and hole of the photo-generated electron-hole pair is transported and trapped into the quantum dot in the second layer so as to enhance the concentration of the corresponding carrier therein, thereby enhancing a rate of injected carriers tunneling through the quantum dot in the second layer into the photon absorption member, wherein the injected carriers are complementary to the corresponding carrier trapped in the quantum dot.

5. The nano-resonator of claim 4, wherein the photon absorption member has a dimension in a scale of micrometers.

6. An array formed with a plurality of nano-resonators of claim 4.

7. A single-photon detector, comprising:
(a) a multilayer structure having a photon absorption layer and a carrier mobile layer formed on the photon absorption layer, the multilayer structure configured to form a quantum well in the carrier mobile layer, the photon absorption layer adapted for generating an electron-hole pair responsive to an incident photon thereto; and
(b) a nano-injector for injecting carriers, having a working end with a dimension in a scale of nanometers formed over the carrier mobile layer and configured to define a quantum dot in the carrier mobile layer directly under the nano-injector, the quantum dot being capable of trapping one type of carriers of electrons and holes while repelling the other type of carriers of electrons and holes, wherein in operation, an electric field is established with a lateral component and a vertical component and a stream of injected carriers flows through the working end of the nano-injector, and wherein the lateral component of the electric field causes one of the electron and hole of the photo-generated electron-hole pair to move towards the quantum dot under the nano-injector and be trapped therein, wherein the presence of the trapped carrier in the quantum dot in turn, enhances a rate of the stream of injected carriers from the working end of the nano-injector tunneling through the quantum dot into the photon absorption layer, thereby resulting in a measurable increase of a corresponding electric current, wherein the injected carriers are complementary to the corresponding carrier trapped in the quantum dot.

8. The single-photon detector of claim 7, wherein the trapped carrier in the quantum dot has a lifetime, $\tau_h$, wherein the stream of injected carriers has a transition time, $\tau_{trans}$, for tunneling through the quantum dot, and wherein $\tau_h \gg \tau_{trans}$.

9. The single-photon detector of claim 8, wherein the trapped carrier in the quantum dot is corresponding to the hole of the photo-generated electron-hole pair, and wherein the injected carriers are corresponding to electrons.

10. The single-photon detector of claim 8, wherein the trapped carrier in the quantum dot is corresponding to the electron of the photo-generated electron-hole pair, and wherein the injected carriers are corresponding to holes.

11. An apparatus for single photon detection, comprising a plurality of single-photon detectors of claim 7, spatially arranged in an array.

12. A single-photon detector, comprising:
(a) a photon absorption layer for generating an electron-hole pair responsive to an incident photon thereto;
(b) a first carrier barrier layer formed on the photon absorption layer;
(c) a carrier mobile layer formed on the first carrier barrier layer;
(d) a second carrier barrier layer formed on the carrier mobile layer to have a carrier barrier region and an oxidized region surrounding the carrier barrier region, the carrier barrier region having a dimension, d, in a scale of nanometers, wherein the carrier mobile layer and the first and second carrier barrier layers are configured to form a first energy band structure having a quantum well in the carrier mobile layer;
(e) a first conductive element in contact with the second carrier barrier layer and positioned over the carrier barrier region of the second carrier barrier layer to form a nano-injector therewith for injecting electrons, which in turn, defines a quantum dot in the carrier mobile layer directly under the nano-injector which is capable of trapping the hole of the photo-generated electron-hole pair while regulating an electron flow through the nano-injector;
(f) a second conductive element in contact with at least the photon absorption layer; and
(g) a power source electrically coupled to the first conductive element and the second conductive element.

13. The single-photon detector of claim 12, being configured such that when a voltage is applied between the first conductive element and the second conductive element from the power source, an electric field is established with a lateral component and a vertical component and a stream of electrons flows through the nano-injector from the first conductive element, and wherein the lateral component of the electric field causes the hole to move towards the quantum dot underneath the nano-injector and be trapped therein, wherein the presence of the trapped hole in the quantum dot in turn, enhances a rate of the stream of electrons tunneling through the quantum dot into the photon absorption layer, thereby resulting in a measurable increase of a corresponding electric current.

14. The single-photon detector of claim 13, wherein each of the stream of electrons moves towards to the second conductive element from the first conductive element unless it is recombined with the trapped hole in the volume, or until the trapped hole is thermally exited and leaves the volume.

15. The single-photon detector of claim 13, wherein the stream of electrons is augmented in a limited region of the photon absorption layer after tunneling through the quantum dot, and wherein the limited region of the photon absorption layer is located under the quantum dot.

16. The single-photon detector of claim 13, wherein the trapped hole in the quantum dot has a lifetime, $\tau_h$, wherein the stream of electrons has a transition time, $\tau_{trans}$, for tunneling through the quantum dot, and wherein $\tau_h \gg \tau_{trans}$.

17. The single-photon detector of claim 12, wherein the carrier mobile layer is made from a hole transporting material, and wherein each of the first and second carrier barrier layers is made from an electron barrier material.

18. The single-photon detector of claim 17, wherein the first carrier barrier layer is made from a semiconductor material.

19. The single-photon detector of claim 18, wherein the second carrier barrier layer is made from a semiconductor material that is same as or different from the semiconductor material of the first carrier barrier layer.

20. The single-photon detector of claim 12, wherein the photon absorption layer is made from a semiconductor material.

21. The single-photon detector of claim 12, further comprising a substrate on which the photon absorption layer is formed.

22. The single-photon detector of claim 21, wherein the substrate is made from one of a semiconductor material, a metallic material and an insulating material.

23. The single-photon detector of claim 12, wherein the dimension d of the carrier barrier region of the second carrier barrier layer is in a range of about 1-500 nm, preferably in a range of about 10-200 nm.

* * * * *